United States Patent
Iizuka

(10) Patent No.: US 9,541,972 B2
(45) Date of Patent: Jan. 10, 2017

(54) MONITORING CONTROL DEVICE, MONITORING CONTROL METHOD, AND RECORDING MEDIUM

(71) Applicant: FUJITSU LIMITED, Kawasaki-shi, Kanagawa (JP)

(72) Inventor: Hiroshi Iizuka, Kasawaki (JP)

(73) Assignee: FUJITSU LIMITED, Kawasaki (JP)

( * ) Notice: Subject to any disclaimer, the term of this patent is extended or adjusted under 35 U.S.C. 154(b) by 322 days.

(21) Appl. No.: 14/282,325

(22) Filed: May 20, 2014

(65) Prior Publication Data

US 2014/0361092 A1 Dec. 11, 2014

(30) Foreign Application Priority Data

Jun. 5, 2013 (JP) .................................. 2013-119292

(51) Int. Cl.
*G06F 1/20* (2006.01)
*H05K 7/20* (2006.01)

(52) U.S. Cl.
CPC ........... *G06F 1/206* (2013.01); *H05K 7/20727* (2013.01); *H05K 7/20836* (2013.01); *Y02B 60/1275* (2013.01)

(58) Field of Classification Search
CPC . G06F 1/206; H05K 7/20727; H05K 7/20836; Y02B 60/1275
See application file for complete search history.

(56) References Cited

U.S. PATENT DOCUMENTS

| 7,948,196 | B2* | 5/2011 | Begun | H05K 7/20209 318/268 |
| 9,037,882 | B2* | 5/2015 | Vadakkanmaruveedu | G06F 1/203 713/300 |
| 2008/0028778 | A1* | 2/2008 | Millet | G06F 1/206 62/129 |
| 2011/0301777 | A1* | 12/2011 | Cox | G06F 1/206 700/299 |
| 2014/0163765 | A1* | 6/2014 | Jain | G06F 1/206 700/300 |

(Continued)

FOREIGN PATENT DOCUMENTS

| JP | 2005-18309 | 1/2005 |
| JP | 2006-157305 | 6/2006 |
| JP | 2010-182786 | 8/2010 |

*Primary Examiner* — Marc Norman
(74) *Attorney, Agent, or Firm* — Fujitsu Patent Center

(57) ABSTRACT

A card control unit for controlling a line card includes a detecting section, a collecting section, and an estimating section. The detecting section detects mounting of a module into a mounting port in the communication card equipped with multiple cages that each have a mounting port into which a module is removably mounted. When mounting of a module has been detected, the collecting section collects an environmental temperature around a mounting port into which the module has been mounted, a power consumption and specified temperature of the module, and thermal resistance information of a cage mounted with the module. The estimating section estimates an environmental temperature after activation of the module on the basis of the collected environmental temperature, power consumption, specified temperature, and thermal resistance information before the module of which the mounting has been detected is activated.

10 Claims, 13 Drawing Sheets

(56) References Cited

U.S. PATENT DOCUMENTS

2014/0371944 A1* 12/2014 Vadakkanmaruveedu  G01K 7/16
                                                  700/299
2015/0148981 A1*  5/2015 Kong ................. G05D 23/1917
                                                  700/299
2015/0220125 A1*  8/2015 Vadakkanmaruveedu  G06F 1/203
                                                  713/320
2015/0378404 A1* 12/2015 Ogawa ................... G06F 1/206
                                                  700/300

* cited by examiner

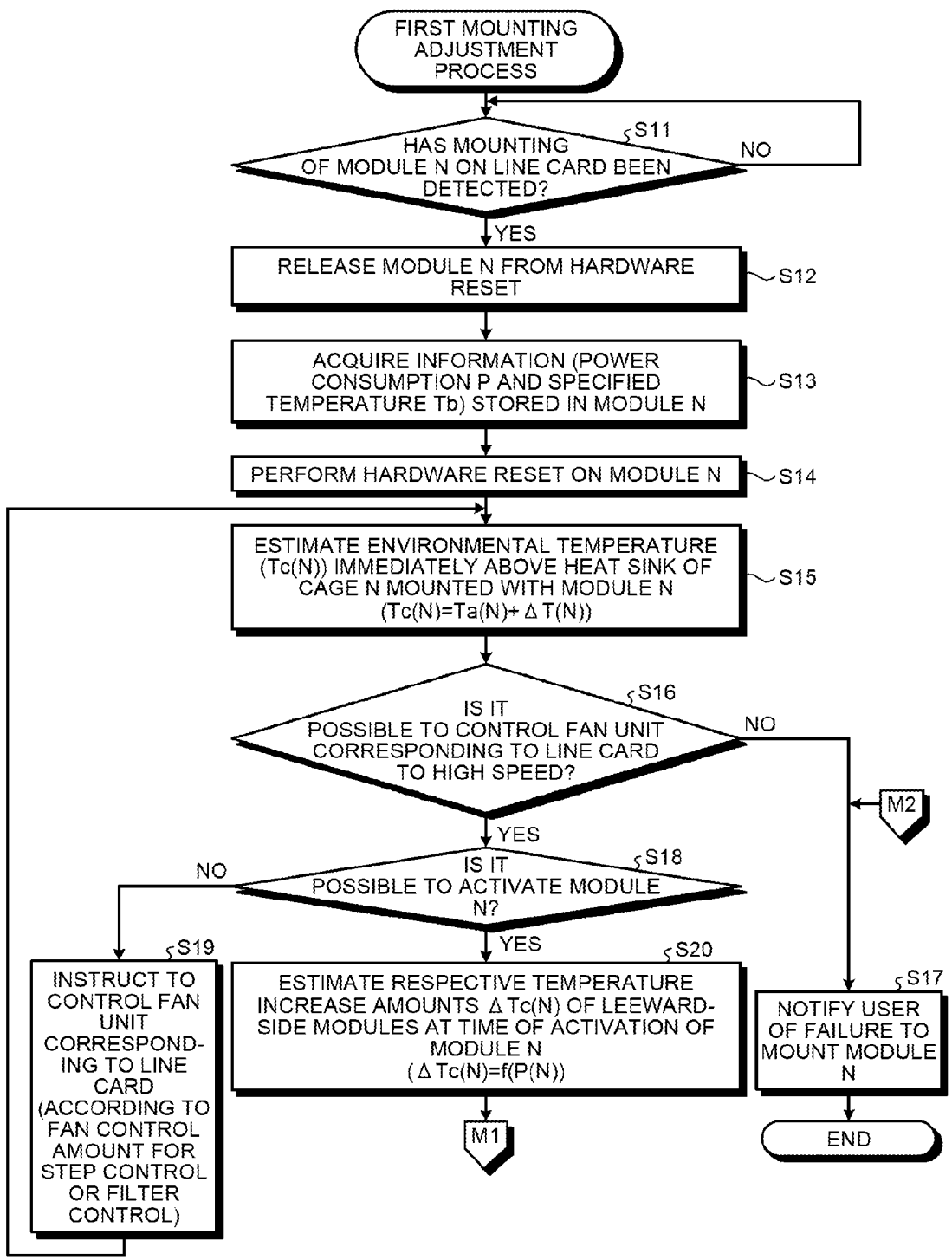

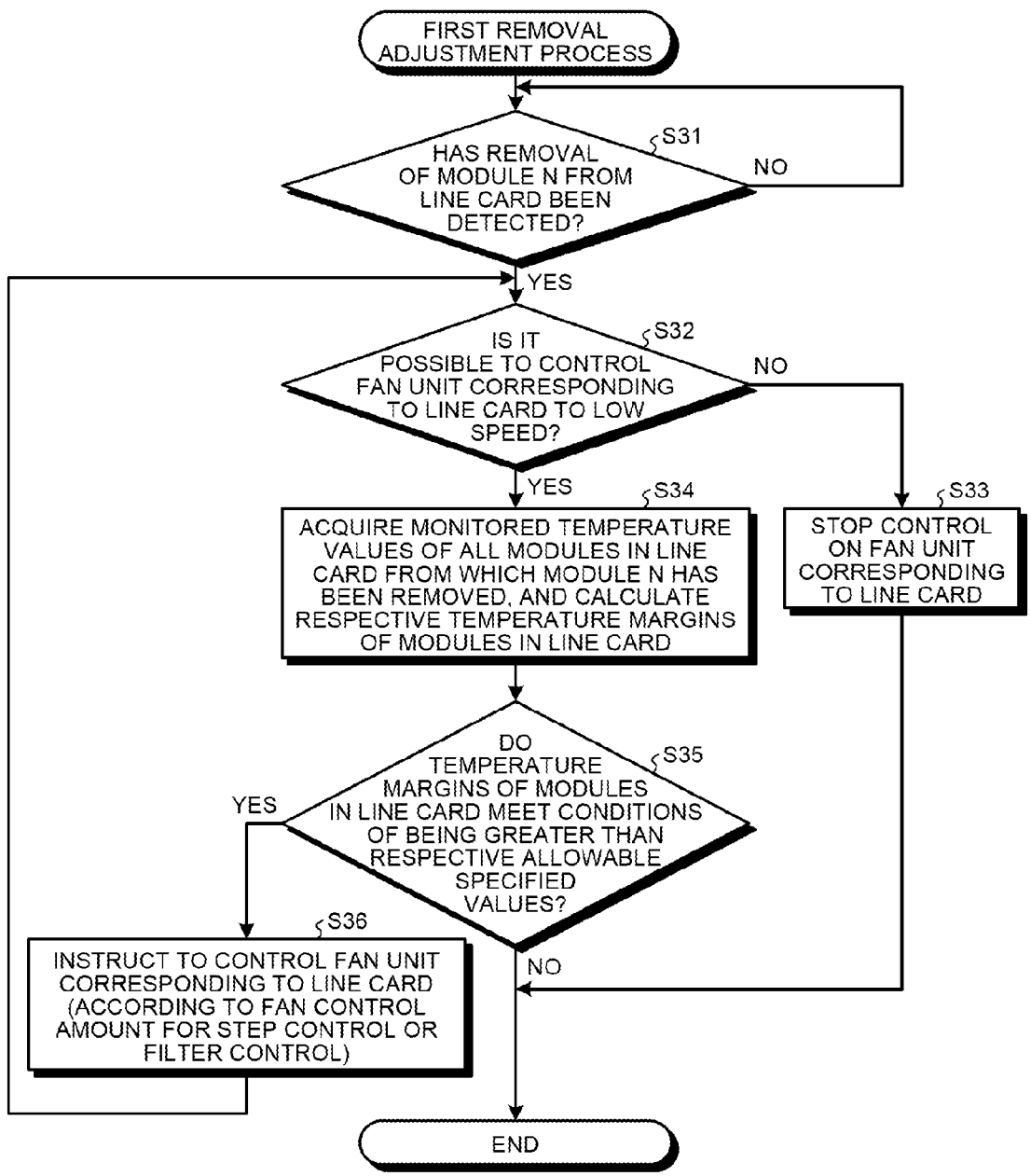

MONITORING CONTROL DEVICE, MONITORING CONTROL METHOD, AND RECORDING MEDIUM

CROSS-REFERENCE TO RELATED APPLICATION

This application is based upon and claims the benefit of priority of the prior Japanese Patent Application No. 2013-119292, filed on Jun. 5, 2013, the entire contents of which are incorporated herein by reference.

FIELD

The embodiments discussed herein are related to a monitoring control device, a monitoring control method, and a recording medium.

BACKGROUND

In recent years, with the increase in traffic, for example, on the Internet or the like, optical transmission devices are expected to achieve increase in data capacity and reduction in size. Line cards housed in an optical transmission device are each equipped with a cage, and multiple optical pluggable modules (hereinafter, referred to simply as "modules") are mounted in the cage. There are multiple types of modules, such as SFP (Small Form-factor Pluggable) modules, XFP (10G Form-factor Pluggable) modules, and CFP (100G Form-factor Pluggable) modules.

Standard specifications for the structure of a cage mounted with modules and the shape of the modules are defined, for example, in INF-8077i in the case of XFP modules and in CFP-MSA in the case of CFP modules. Therefore, modules compliant with standard specifications can be removably mounted into mounting ports in a cage.

However, there exist a variety of modules depending on support conditions, such as a transmission distance and an internal function. For example, XFP modules range in power consumption from 1 to 6 W depending on specifications. Furthermore, CFP modules range in power consumption from 8 to 32 W depending on specifications. Therefore, an amount of generated heat varies according to power consumptions of modules mounted on a line card housed in an optical transmission device, and thus internal device environmental temperature also varies significantly.

Furthermore, a tolerable standard temperature of internal device environmental temperature is set in the optical transmission device, and the optical transmission device adjusts the environmental temperature to be less than or equal to the standard temperature. Specifically, the optical transmission device is equipped with an air-cooling fan for cooling the inside of the device, and adjusts the internal device environmental temperature by controlling the fan. Incidentally, the flow of air from the fan in the optical transmission device depends on the structure and installation position of a cage regardless of whether a module has been mounted in the cage or whether the module has been activated. An example of related art is described in Japanese Laid-open Patent Publication No. 2006-157305, Japanese Laid-open Patent Publication No. 2010-182786 and Japanese Laid-open Patent Publication No. 2005-18309.

In an optical transmission device, internal device environmental temperature varies according to a power consumption of a mounted module; however, it is difficult to determine whether the internal device environmental temperature is less than or equal to a specified internal device temperature, until the module is actually mounted and activated.

SUMMARY

According to an aspect of an embodiment, a monitoring control device includes a detecting unit that detects mounting of a module into a mounting part in a communication card equipped with multiple mounting parts into which modules are removably mounted; a collecting unit that collects, when mounting of a module has been detected, an environmental temperature around a mounting part into which the module has been mounted, a power consumption and specified temperature of the module, and thermal resistance information of the mounting part mounted with the module; and an estimating unit that estimates an environmental temperature after activation of the module on the basis of the collected environmental temperature, power consumption, specified temperature, and thermal resistance information before the module of which the mounting has been detected is activated.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5A and FIG. 5B are a flowchart illustrating an example of processing operation of a card control unit involved in a first mounting adjustment process;

FIG. 6 is a flowchart illustrating an example of processing operation of the card control unit involved in a first removal adjustment process;

DESCRIPTION OF EMBODIMENTS

Preferred embodiments of the present invention will be explained with reference to accompanying drawings. Incidentally, the technology discussed herein is not limited to the following embodiments. Furthermore, the embodiments described below can be arbitrarily combined within a scope which does not cause a conflict.

[a] First Embodiment

Figure 1:
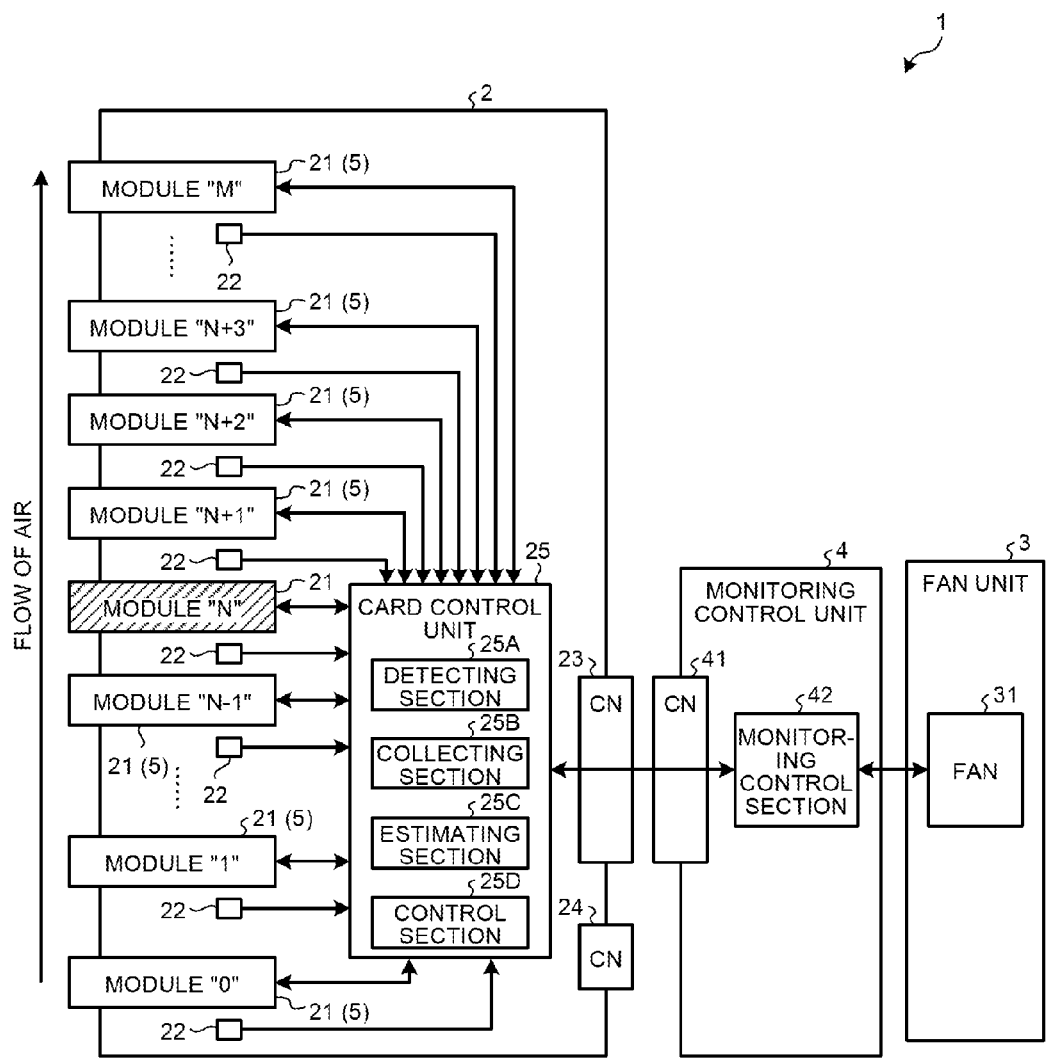
FIG. 1 is an explanatory diagram illustrating an example of an optical transmission device according to a first embodiment.
Figure 2:
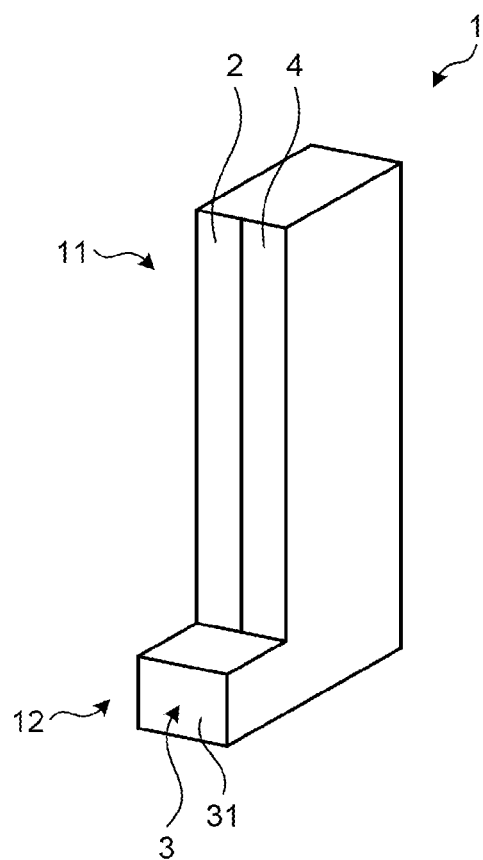
FIG. 2 is an explanatory diagram illustrating an example of the appearance of the optical transmission device according to the first embodiment.
Figure 3:
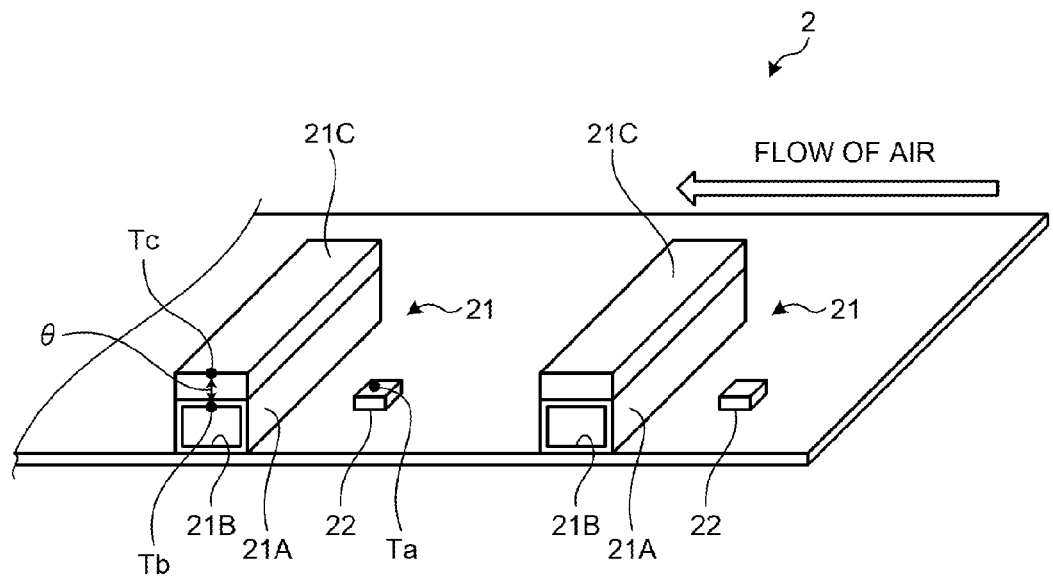
FIG. 3 is an explanatory diagram schematically illustrating an example of a line card.

FIG. 1 is an explanatory diagram illustrating an example of an optical transmission device 1 according to a first embodiment. FIG. 2 is an explanatory diagram illustrating an example of the appearance of the optical transmission device 1 according to the first embodiment. FIG. 3 is an explanatory diagram schematically illustrating an example of a line card 2. The optical transmission device 1 illustrated in FIG. 1 includes the line card 2, a fan unit 3, and a monitoring control unit 4. As illustrated in FIG. 2, the line card 2 and the monitoring control unit 4 are housed/placed in an upper part 11 of the optical transmission device 1, and, for example, one fan unit 3 is housed/placed in a lower part 12.

The line card 2 can be mounted with, for example, M number of XFP modules 5, and includes mounting parts 21, temperature sensors 22, a connection connector 23, a power connector 24, and a card control unit 25. As illustrated in FIG. 3, each of the mounting parts 21 includes a cage 21A and a heat sink 21C; the cage 21A has a mounting port 21B into which a module 5 is removably mounted, and the heat sink 21C is placed on top of the cage 21A. The heat sink 21C is a radiator having radiating fins for dissipating heat from the module 5 mounted into the mounting port 21B.

The temperature sensors 22 are placed near the cages 21A, respectively; the temperature sensor 22 measures an environmental temperature of the windward side of a corresponding cage 21A exposed to air from a fan 31 in the fan unit 3, and detects the environmental temperature as an ambient environmental temperature Ta of a corresponding cage 21A. The connection connector 23 is a connector connecting to the monitoring control unit 4. The power connector 24 is a connector for connecting to a power source (not illustrated). The card control unit 25 controls the entire line card 2. The card control unit 25 collects respective ambient environmental temperatures Ta of the cages 21A from the temperature sensors 22, and notifies the monitoring control unit 4 of a fan control amount for adjustment of the air velocity of each fan 31 in the fan unit 3.

The card control unit 25 reads out various programs from a memory (not illustrated), and implements various processes as functions on the basis of the programs. The card control unit 25 includes, as the functions, a detecting section 25A, a collecting section 25B, an estimating section 25C, and a control section 25D. The detecting section 25A detects mounting of a module 5 into a mounting port 21B. Upon detection of mounting of a module 5, the collecting section 25B collects an ambient environmental temperature Ta near the mounting port 21B into which the module 5 has been mounted, a power consumption P and specified temperature Tb of the module 5, and thermal resistance information θ of a cage 21A mounted with the module 5. The estimating section 25C estimates an environmental temperature after activation of the module 5 on the basis of the collected ambient environmental temperature Ta, power consumption P, specified temperature Tb, and thermal resistance information θ before the module 5 of which the mounting has been detected is activated. The control section 25D controls the entire card control unit 25, and notifies the monitoring control unit 4 of a fan control amount which is an amount of control on the fan unit 3.

The fan unit 3 contains, for example, two fans 31 that lower the environmental temperature inside of the optical transmission device 1, for example, by air cooling. As illustrated in FIG. 2, each of the fans 31 sends cooling air from a windward-side lower part to a leeward-side upper part of the optical transmission device 1. This means the cooling air flows, for example, in a direction from a module 5(0) toward a module 5(M) as illustrated in FIG. 1. Incidentally, for convenience of explanation, a reference symbol in a parenthesis denotes mounting number that identifies the mounting position of a module 5 mounted on the line card 2. Then, the fan unit 3 lowers the ambient environmental temperature Ta of each cage 21A in the line card 2 with cooling air from each fan 31.

The monitoring control unit 4 controls the entire fan unit 3, and includes a connection connector 41 and a monitoring control section 42. The connection connector 41 is a connector electrically connecting to the connection connector 23 in the line card 2. The monitoring control section 42 controls the entire monitoring control unit 4. The monitoring control section 42 controls each fan 31 in the fan unit 3 according to a fan control amount notified from the card control unit 25, and monitors respective control states of the fans 31 in the fan unit 3.

The collecting section 25B in the card control unit 25 collects an ambient environmental temperature Ta of each cage 21A and a specified temperature Tb of each cage 21A. The collecting section 25B collects an environmental temperature measured by the temperature sensor 22 for each cage 21A as an ambient environmental temperature Ta inside of the cage 21A. The specified temperature Tb is the maximum allowable temperature that a cage 21A with modules 5 mounted into mounting ports 21B thereof can withstand. Incidentally, the collecting section 25B communicates with a module 5 mounted into a mounting port 21B in a cage 21A on the line card 2, and collects in a ROM (not illustrated) in the module 5. The stored information is information including a power consumption P at the time of activation of the module 5 and a specified temperature Tb of the cage 21A mounted with the module 5, etc.

Incidentally, for convenience of explanation, a cage 21A with mounting number "N" is referred to as a cage 21A(N); a mounting port 21B of the cage 21A(N) is referred to as a mounting port 21B(N); a corresponding heat sink 21C is referred to a heat sink 21C(N); and a module 5 mounted in the cage 21A(N) is referred to as a module 5(N).

The estimating section 25C in the card control unit 25 estimates an environmental temperature Tc(N) immediately above a heat sink 21C of, for example, a cage 21A(N) with mounting number "N" on the basis of an ambient environmental temperature Ta(N) of the cage 21A(N) and a correction value ΔT(N). In other words, the estimating section 25C calculates the environmental temperature Tc(N) immediately above the heat sink 21C using the following equation: Tc(N)=Ta(N)+ΔT(N). That is, the estimating section 25C can estimate an environmental temperature Tc(N) after activation of a module 5(N) mounted in the cage 21A(N) without having to actually activate the module 5(N). Incidentally, based on a specified temperature Tb(N), a thermal resistance value θ(N), and a power consumption P(N) of the module 5(N), the environmental temperature Tc(N) can be calculated by the following equation: Tc(N)=Tb(N)−θ(N)*P(N). The thermal resistance value θ(N) is a thermal resistance value calculated based on the thickness of a region between the top surface of a mounting port 21B(N) of the cage 21A(N) and the top surface of the heat sink 21C(N) immediately above the mounting port 21B(N) and respective thermal conductivities of materials of the cage 21A and the heat sink 21C. Furthermore, based on the ambient environmental temperature Ta(N) of the cage 21A(N) and the environmental temperature Tc(N) immediately above the heat sink 21C, the correction value ΔT(N) can be calculated by the following equation: ΔT(N)=Tc(N)−Ta(N).

Figure 4:
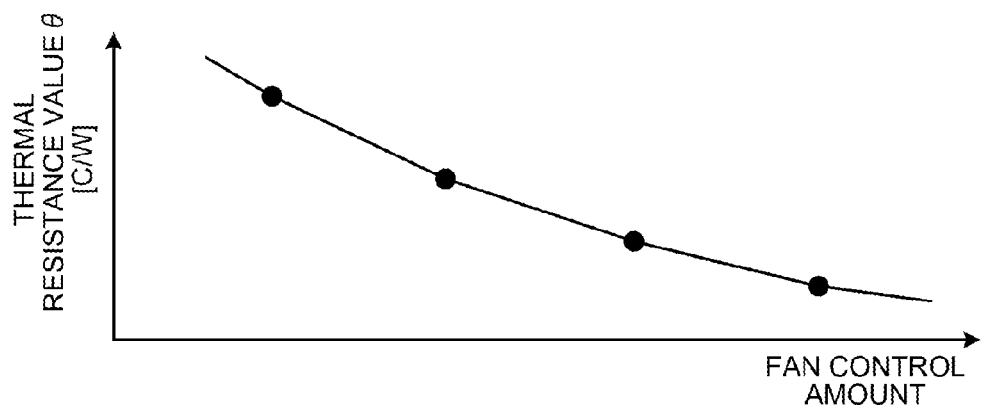
FIG. 4 is an explanatory diagram illustrating an example of a relation between thermal resistance value and fan control amount.

FIG. 4 is an explanatory diagram illustrating an example of a relation between thermal resistance value θ and fan control amount. As illustrated in FIG. 4, cooling effect due to a fan control amount of the fan unit 3 on the line card 2 can be obtained by a fan control amount proportional to air velocity of the fan unit 3 and a function of a thermal resistance value θ of a heat sink 21C. That is, cooling effect increases with an increase in fan control amount of the fan unit 3 as illustrated in FIG. 4; therefore, the thermal resistance value θ can be obtained as a function of a fan control amount in advance. Consequently, the cooling effect of the fan unit 3 can be recognized in advance by using the relation between thermal resistance value θ and fan control amount illustrated in FIG. 4. Incidentally, the card control unit 25 obtains the thermal resistance value θ as illustrated in FIG. 4 in advance, and, if it is possible to monitor respective power consumptions of mounted modules 5, can be configured to estimate a specified temperature Tb of a module 5 at the time of activation of the module 5.

Before activation of, for example, a module 5(N), the estimating section 25C estimates an environmental temperature Tc(N) after the activation of the module 5(N) in advance on the basis of an ambient environmental temperature Ta(N) and a specified temperature Tb(N). Furthermore, the control section 25D in the card control unit 25 determines whether it is possible to control a fan unit 3 corresponding to a line card 2 mounted with the mounted module 5(N) to high speed on the basis of the environmental temperature Tc(N). Incidentally, controlling the fan unit 3 to high speed is control for increasing the fan speed of the fans 31 in the fan unit 3 to high speed. When it is possible to control the fan unit 3 corresponding to the line card 2 to high speed, the control section 25D determines whether the module 5(N) can be activated or not. Incidentally, whether the module 5(N) can be activated or not is determined by whether it is possible to control the fan unit 3 to high speed. When having determined that the module 5(N) can be activated, the control section 25D notifies the monitoring control unit 4 of a fan control amount to adjust the fan speed of the fans 31 to high speed and thereby lowers the environmental temperature Tc(N) to below the specified temperature Tb. As a result, the monitoring control section 42 in the monitoring control unit 4 sets the fan speed of the fans 31 to high speed according to the fan control amount notified from the card control unit 25. Incidentally, the fan control amount is a control amount for adjusting the fan speed of the fans 31. For example, when the fan control amount is high, the fan speed of the fans 31 is adjusted to high speed; on the other hand, when the fan control amount is low, the fan speed of the fans 31 is adjusted to low speed.

Furthermore, before the activation of the module 5(N), the estimating section 25C estimates the influence of a blast of heat from the module 5(N) to modules 5 that operate on the leeward side. In other words, before the activation of the module 5(N), the estimating section 25C estimates the influence of heat from the module 5(N) on modules 5(N+1), 5(N+2), . . . , and 5(M) located on the leeward side of the module 5(N).

The control section 25D determines whether a fan control amount has reached an upper limit in the adjustment of the fans 31. Incidentally, the upper limit is an upper threshold of a fan control amount to adjust the fan speed of the fans 31 to high speed. Then, when a fan control amount has reached the upper limit, the control section 25D notifies the monitoring control unit 4 of a result of the determination. When having received a result of the determination that a fan control amount has reached the upper limit, the monitoring control section 42 of the monitoring control unit 4 determines that the module 5(N) cannot be activated because it is not possible to increase the fan speed of the fans 31 to high speed. When having determined that the module 5(N) cannot be activated, the monitoring control section 42 notifies a user of the failure to mount the module 5(N). Incidentally, as a way to notify the user of the failure to mount the module 5(N), for example, the monitoring control section 42 can cause an indicating lamp (not illustrated) to blink in red, or can output a warning sound.

Furthermore, for example, when a module 5(N) has been removed from a mounting port 21B on a line card 2, the control section 25D monitors respective temperatures of all modules 5 on the line card 2. The control section 25D determines whether it is possible to control a fan unit 3 corresponding to the line card 2 from which the module 5(N) has been removed to low speed. Incidentally, controlling the fan unit 3 to low speed is control for decreasing the fan speed of fans 31 in the fan unit 3 to low speed. When it is possible to control the fan unit 3 to low speed, the control section 25D notifies the monitoring control unit 4 of a fan control amount to adjust the fan speed of the fans 31 to low speed. The monitoring control section 42 decreases the fan speed of fans 31 corresponding to the line card 2 to low speed according to the fan control amount notified from the card control unit 25.

Figure 5B:
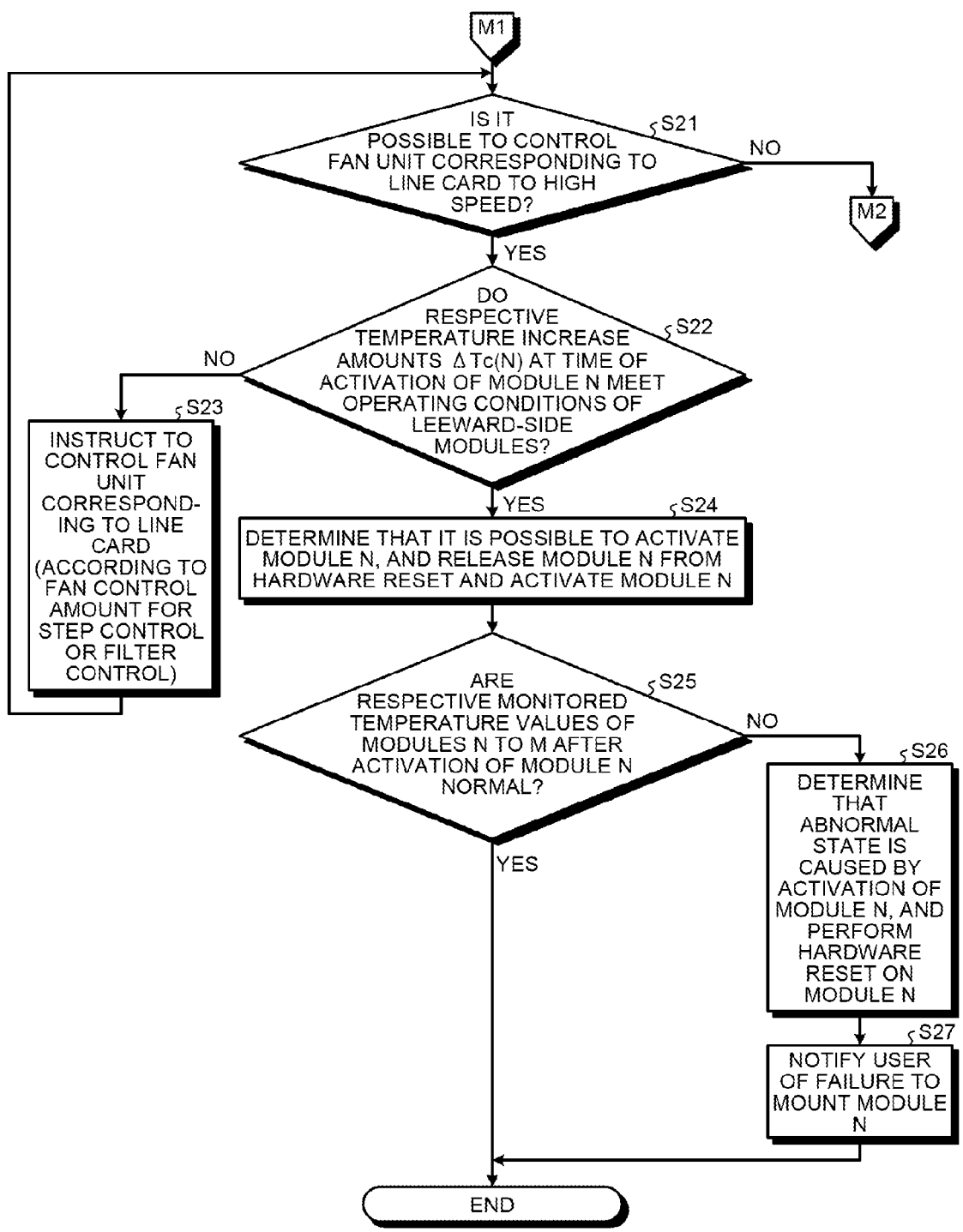

Subsequently, the operation of the optical transmission device 1 according to the first embodiment is explained. Assume, for example, that a new module 5 is mounted into an empty mounting port 21B(N) in a line card 2 installed in the optical transmission device 1. FIG. 5A and FIG. 5B are a flowchart illustrating an example of processing operation of the card control unit 25 involved in a first mounting adjustment process according to the first embodiment. The first mounting adjustment process illustrated in FIG. 5A and FIG. 5B are a process to determine, when the mounting of a new module 5(N) has been detected, whether the device is in an environment in which the module 5(N) can be activated before the module 5(N) is activated and adjust the device environment on the basis of a result of the determination. Incidentally, for convenience of explanation, in the optical transmission device 1, for example, a mounting port 21B(N) shall be unoccupied, and the other mounting ports 21B other than the mounting port 21B(N) shall have been mounted with modules 5.

In FIG. 5A, whether the detecting section 25A in the card control unit 25 has detected mounting of a module 5 into a mounting port 21B(N) of the line card 2 is determined (Step S11). Incidentally, the detecting section 25A regularly monitors a REMOVE signal output from a mounting port 21B(N) when a module 5 is removed from the mounting port 21B(N), and detects whether the module 5 has been mounted into the mounting port 21B(N) on the basis of a REMOVE signal.

When mounting of a module 5 has been detected (YES at Step S11), the control section 25D releases the module 5(N) from hardware reset (Step S12). Incidentally, a state of a module 5 released from hardware reset means a state where a laser diode (not illustrated) in the module 5 has shut down. In this state, heat generated from the module 5(N) does not affect an ambient environmental temperature Ta(N), and the collecting section 25B in the card control unit 25 can collect information stored in a ROM in the module 5(N).

The collecting section 25B collects information stored in the ROM of the module 5(N) released from hardware reset (Step S13). Incidentally, the stored information includes a power consumption P and specified temperature Tb of the module 5(N) as Physical Inventory information.

The control section 25D performs hardware reset on the module 5(N) (Step S14). Incidentally, the hardware reset is performed to ignore the influence of heat generated by the module 5(N).

The estimating section 25C estimates an environmental temperature Tc(N) immediately above a heat sink 21C of the mounting port 21B(N) (Step S15). Incidentally, using an ambient environmental temperature Ta(N) measured by the temperature sensor 22 on the windward side of the mounting port 21B(N) and a correction value $\Delta T(N)$, the estimating section 25C calculates $Ta(N)+\Delta T(N)=Tc(N)$. Then, the estimating section 25C calculates the environmental temperature Tc(N) immediately above the heat sink 21C of the mounting port 21B(N).

After the estimation of the environmental temperature Tc(N), the control section 25D determines whether it is possible to control a fan unit 3 corresponding to the line card 2 mounted with the module 5(N) to high speed (Step S16). Incidentally, the control section 25D determines whether a fan control amount of the fan unit 3 has reached an upper limit, and, when the fan control amount has reached the upper limit, determines that it is not possible to control the fan unit 3 to high speed. On the other hand, when the fan control amount of the fan unit 3 has not reached the upper limit, the control section 25D determines that it is possible to control the fan unit 3 to high speed.

When having determined that it is not possible to control the fan unit 3 to high speed (NO at Step S16), the control section 25D instructs the monitoring control section 42 to notify a user of the failure to mount the module 5(N) into the mounting port 21B(N) (Step S17). Then, the control section 25D terminates the processing operation illustrated in FIG. 5A. Then, in response to an instruction from the card control unit 25, the monitoring control section 42 outputs a notification of the failure to mount the module 5(N). Consequently, the user can recognize the failure to mount the module 5(N) from the notification output from the monitoring control section 42.

When having determined that it is possible to control the fan unit 3 to high speed (YES at Step S16), the control section 25D determines whether it is possible to activate the module 5(N) mounted into the mounting port 21B(N) (Step S18). Incidentally, the collecting section 25B communicates with the module 5(N) and acquires information stored in the module 5(N), and collects a power consumption P and specified temperature Tb included in the acquired stored information. Furthermore, the collecting section 25B collects a thermal resistance value $\theta$ of the mounting port 21B(N) and the heat sink 21C(N). Then, the control section 25D determines whether a condition of $Tb(N) > Tc(N) + \theta(N)$ *P(N) is satisfied. When the condition of $Tb(N) > Tc(N) + \theta(N)*P(N)$ is satisfied, the control section 25D determines that it is possible to activate the module 5(N). On the other hand, when the condition of $Tb(N) > Tc(N) + \theta(N)*P(N)$ is not satisfied, the control section 25D determines that it is not possible to activate the module 5(N). Incidentally, the thermal resistance value $\theta(N)$ can be a value obtained from the relation with a fan control amount of the fan unit 3 illustrated in FIG. 4 which has been found through actual measurement in advance, or a result of thermal design simulation can be used as the thermal resistance value $\theta(N)$.

When having determined that it is not possible to activate the module 5(N) (NO at Step S18), the control section 25D notifies the monitoring control section 42 of a fan control amount to control the fan unit 3 corresponding to the line card 2 mounted with the module 5(N) (Step S19). As a result, the monitoring control section 42 performs step control or filter control on the fan unit 3 corresponding to the line card 2 mounted with the module 5(N) according to the fan control amount notified from the control section 25D. After the control on the fan unit 3 is performed, the process returns to Step S15, and the estimating section 25C estimates an environmental temperature Tc(N) of the mounting port 21B(N).

When the control section 25D has determined that it is possible to activate the module 5(N) (YES at Step S18), the estimating section 25C estimates respective temperature increase amounts $\Delta Tc(N)$ of modules 5 on the leeward side of the module 5(N) at the time of activation of the module 5(N) (Step S20). Incidentally, leeward-side modules 5 of, for example, a module 5(N) are modules 5(N+1), 5(N+2), . . . , and 5(M). When the module 5(N) is activated, all the leeward-side modules 5 are affected by heat generated by the module 5(N), and temperatures of the leeward-side modules 5 may exceed their specified temperatures Tb; therefore, the process at Step S20 is performed to check the influence of the heat.

The estimating section 25C estimates, for example, as a function of the power consumption P(N) included in the information stored in the module 5(N), an amount $\Delta Tc(N)$ of change in environmental temperature immediately above the heat sink 21C at the time of activation of the module 5(N). Incidentally, $\Delta Tc(N)$ equals $f(P(N))$. A relation between the power consumption P(N) and the environmental temperature change amount $\Delta Tc(N)$ can be obtained through actual measurement in advance and acquired as table information, or can be determined by thermal design simulation.

In FIG. 5B, after the estimation of the respective temperature increase amounts $\Delta Tc(N)$ of all the leeward-side modules 5 at the time of activation of the module 5(N), the control section 25D determines whether it is possible to control the fan unit 3 corresponding to the line card 2 to high speed (Step S21). When it is possible to control the fan unit 3 to high speed (YES at Step S21), the control section 25D determines whether all the mounted modules 5(N+1), 5(N+2), . . . , and 5(M) on the leeward side of the module 5(N) meet operating conditions, respectively (Step S22). For example, the control section 25D determines whether conditions of $Tb(N+1)-Td(N+1) > \Delta Tc(N)$, $Tb(N+2)-Td(N+2) > \Delta Tc(N)$, . . . , and $Tb(M)-Td(M) > \Delta Tc(N)$ are satisfied. Incidentally, the cage temperature Td is a monitored temperature of a cage 21A; for example, Td(N+1) denotes a monitored temperature of a cage 21A(N+1).

When all the leeward-side modules 5 do not meet the operating conditions (NO at Step S22), the control section 25D notifies the monitoring control section 42 of a fan control amount to control the fan unit 3 corresponding to the line card 2 mounted with the module 5(N) (Step S23). As a result, the monitoring control section 42 performs step control or filter control on the fan unit 3 corresponding to the line card 2 mounted with the module 5(N) according to the fan control amount notified from the control section 25D. After the control on the fan unit 3 is performed, the process returns to Step S21, and the control section 25D determines whether it is possible to control the fan unit 3 to high speed.

When the control section 25D has determined that it is not possible to control the fan unit 3 to high speed (NO at Step S21), the process returns to Step S17 to notify the user of the failure to mount the module 5(N) into the mounting port 21B(N).

When all the leeward-side modules 5 meet the operating conditions (YES at Step S22), the control section 25D determines that it is possible to activate the module 5(N), and releases the module 5(N) from the hardware reset and activates the module 5(N) (Step S24).

After having released the module 5(N) from the hardware reset and activated the module 5(N), the control section 25D determines whether respective monitored temperature values of the module 5(N) and all the leeward-side modules 5(N+1), 5(N+2), . . . , and 5(M) are normal (Step S25). Incidentally, at Step S25, with respect to each module 5, whether a monitored temperature value Tm is less than or equal to a normal value Tf is determined. In other words, whether conditions of Tf(N)>Tm(N), Tf(N+1)>Tm(N+1), Tf(N+2)>Tm(N+2), . . . , and Tf(M)>Tm(M) are satisfied is determined.

When respective monitored temperature values Tm of the module 5(N) and all the leeward-side modules 5(N+1), . . . , and 5(M) are less than or equal to normal values Tf (YES at Step S25), the control section 25D terminates the processing operation illustrated in FIG. 5B.

When any of respective monitored temperature values Tm of the module 5(N) and all the leeward-side modules 5 exceed the normal values Tf (NO at Step S25), the control section 25D determines that an abnormal state is caused by the activation of the module 5(N). Then, when having determined that an abnormal state is caused by the activation of the module 5(N), the control section 25D performs hardware reset on the module 5(N) (Step S26). After performing hardware reset on the module 5(N), the control section 25D instructs the monitoring control section 42 to notify the user of the failure to mount the module 5(N) (Step S27), and terminates the processing operation illustrated in FIG. 5B. Then, in response to the instruction from the control section 25D, the monitoring control section 42 outputs a notification of the failure to mount the module 5(N). Consequently, the user can recognize the failure to mount the module 5(N) from the notification output from the monitoring control section 42. When the detecting section 25A has not detected mounting of a module 5 (NO at Step S11), Step S11 is repeated until the detecting section 25A has detected mounting of a module 5.

In the first mounting adjustment process illustrated in FIG. 5A and FIG. 5B, upon detection of mounting of a module 5(N), the card control unit 25 estimates an environmental temperature Tc(N) immediately above a heat sink 21C of a cage 21A(N) on the basis of an ambient environmental temperature Ta(N) of the cage 21A(N) and a correction value ΔT(N). Consequently, the card control unit 25 can estimate an environmental temperature Tc(N) after activation of the module 5(N) without having to actually activate the module 5(N) mounted into a mounting port 21B(N).

The card control unit 25 can derive the correction value ΔT(N) on the basis of an ambient environmental temperature Ta(N) detected by the temperature sensor 22, a power consumption P and specified temperature Tb acquired from the module 5(N), and a thermal resistance value θ of the cage 21A(N) mounted with the module 5(N). Consequently, the card control unit 25 can obtain the correction value ΔT(N) used in estimation of the environmental temperature Tc(N).

Furthermore, after the estimation of the environmental temperature Tc(N), the card control unit 25 determines whether it is possible to control a fan unit 3 corresponding to the module 5(N) to high speed, and, when it is not possible to control the fan unit 3 to high speed, outputs information indicating the failure to mount the module 5(N). Consequently, a user can recognize the failure to mount the module 5(N) on the basis of the output information.

After the estimation of the environmental temperature Tc(N), if it is possible to control the fan unit 3 to high speed and the specified temperature Tb(N) meets a condition of Tb(N)>Tc(N)+θ(N)*P(N), the card control unit 25 determines that it is possible to activate the module 5(N). Then, when it is possible to activate the module 5(N), the card control unit 25 estimates respective temperature increase amounts ΔTc(N) of modules 5 on the leeward side of the module 5(N). Consequently, the card control unit 25 can estimate influence on the modules 5 on the leeward side of the module 5(N) on the basis of the temperature increase amounts ΔTc(N) of the leeward-side modules 5.

When it is possible to control the fan unit 3 to high speed, and it is not possible to activate the module 5(N), the card control unit 25 controls fans 31 in the fan unit 3 to put the cage 21A(N) into a state capable of activating the module 5(N). Consequently, by controlling the fans 31, the card control unit 25 can adjust the temperature to a temperature at which the module 5(N) can be activated.

After the estimation of the temperature increase amounts ΔTc(N) of the modules 5 on the leeward side of the module 5(N), if it is possible to control the fan unit 3 to high speed and the temperature increase amounts ΔTc(N) meet operating conditions of the leeward-side modules 5, the card control unit 25 activates the module 5(N). Then, after the activation of the module 5(N), the card control unit 25 determines whether respective monitored temperature values of the module 5(N) to 5(M) are normal, and, if any of the monitored temperature values are not normal, outputs information indicating an abnormal state due to the activation of the module 5(N). Consequently, the user can recognize abnormality of the module 5(N) on the basis of the output information.

When any of the temperature increase amounts ΔTc(N) do not meet the operating conditions of the leeward-side modules 5, the card control unit 25 controls the fans 31 in the fan unit 3 so that the operating conditions of the leeward-side modules 5 are satisfied. Consequently, by controlling the fans 31 in the fan unit 3, the card control unit 25 can adjust the environmental temperature to an environmental temperature at which the operating conditions of the leeward-side modules 5 are satisfied.

Subsequently, the operation of the optical transmission device 1 when a module 5 is removed from a line card 2 is explained. FIG. 6 is a flowchart illustrating an example of processing operation of the card control unit 25 involved in a first removal adjustment process according to the first embodiment. Incidentally, for convenience of explanation, assume that a module 5(N) is removed from a line card 2. The first removal adjustment process illustrated in FIG. 6 is a process to control, upon detection of removal of a module 5(N) from a mounting port 21B, a fan unit 3 to low speed if it is possible after the removal of the module 5(N).

In FIG. 6, whether the detecting section 25A has detected removal of a module 5(N) from a line card 2 is determined (Step S31). Incidentally, the detecting section 25A regularly monitors a REMOVE signal from a mounting port 21B(N), and detects whether a module 5(N) has been removed from the mounting port 21B(N) on the basis of a REMOVE signal.

When removal of a module 5(N) has been detected (YES at Step S31), the control section 25D determines whether it is possible to control a fan unit 3 to low speed (Step S32). Incidentally, the control section 25D determines whether a fan control amount has reached a lower limit, and, when the fan control amount has reached the lower limit, determines that it is not possible to control the fan unit 3 to low speed. On the other hand, when the fan control amount has not reached the lower limit, the control section 25D determines that it is possible to control the fan unit 3 to low speed.

When having determined that it is not possible to control the fan unit 3 to low speed (NO at Step S32), the control section 25D notifies the monitoring control section 42 of that so as to halt fans 31 of the fan unit 3 corresponding to the line card 2 (Step S33), and terminates the processing operation illustrated in FIG. 6. Consequently, the optical transmission device 1 can reduce power consumption of the entire device in accordance with the halt of the fans 31 of the fan unit 3.

When having determined that it is possible to control the fan unit 3 to low speed (YES at Step S32), the control section 25D calculates respective temperature margins of all modules 5 in the line card 2 from which the module 5(N) has been removed (Step S34). Incidentally, the collecting section 25B acquires a specified temperature Tb of each module 5 from stored information in the module 5. Furthermore, the control section 25D acquires a monitored temperature value Tm of each module 5. The control section 25D calculates a temperature margin Tx of each module 5 using an equation of Tb−Tm based on the specified temperature Tb and monitored temperature value Tm of the module 5. The temperature margin Tx is a difference in temperature between the monitored temperature value Tm, which is the current temperature, and the specified temperature Tb, and is a margin of temperature increase from the current temperature Tm up to the specified temperature Tb.

The control section 25D calculates respective temperature margins Tx of the modules 5 on the basis of $Tx(1)=Tb(1)-Tm(1)$, $Tx(2)=Tb(2)-Tm(2)$, ..., and $Tx(M)=Tb(M)-Tm(M)$. In this way, the control section 25D calculates the respective temperature margins Tx of all the modules 5 in the line card 2 from which the module 5(N) has been removed.

After having calculated the respective temperature margins Tx of the modules 5 in the line card 2, the control section 25D determines whether the temperature margins Tx of the modules 5 meet conditions of being greater than respective allowable specified values Tz (Step S35). Incidentally, the allowable specified value Tz is an allowable specified value that each module 5 can withstand. The control section 25D determines whether the conditions of $Tx(1)>Tz(1)$, $Tx(2)>Tz(2)$, ..., and $Tx(M)>Tz(M)$ are all satisfied.

When all the temperature margins Tx of the modules 5 meet the conditions of being greater than the respective allowable specified values Tz (YES at Step S35), the control section 25D notifies the monitoring control section 42 of a fan control amount to control the fan unit 3 corresponding to the line card 2 (Step S36). The monitoring control section 42 controls the fans 31 in the fan unit 3 corresponding to the line card 2 according to the fan control amount notified from the control section 25D. As a result, the fan speed of the fans 31 in the device is decreased to low speed, and therefore the optical transmission device 1 can reduce power consumption of the entire device. Then, after the control section 25D has notified the fan control amount at Step S36, the process returns to Step S32.

On the other hand, when all the temperature margins Tx of the modules 5 do not meet the conditions of being greater than the respective allowable specified values Tz (NO at Step S35), the control section 25D terminates the processing operation illustrated in FIG. 6. Furthermore, when removal of a module 5(N) has not been detected (NO at Step S31), Step S31 is repeated until the detecting section 25A has detected removal of a module 5(N).

In the first removal adjustment process illustrated in FIG. 6, when the card control unit 25 has detected removal of a module 5(N) from a line card 2, the influence of heat generated from the module 5(N) is eliminated, so temperature margins of modules 5 on the leeward side of the module 5(N) are increased. Consequently, the card control unit 25 can decrease the fan speed of fans 31 in a fan unit 3 to low speed, and therefore power consumption of the entire device can be reduced.

When the optical transmission device 1 according to the first embodiment has detected mounting of a module 5(N), the optical transmission device 1 estimates an environmental temperature Tc(N) immediately above a heat sink 21C of a cage 21A(N) on the basis of an ambient environmental temperature Ta(N) of the cage 21A(N) and a correction value ΔT(N). Consequently, the optical transmission device 1 can estimate an environmental temperature Tc(N) after activation of the module 5(N) without having to actually activate the module 5(N) mounted into a mounting port 21B(N).

The optical transmission device 1 controls a fan unit 3 on the basis of the estimated environmental temperature Tc(N) after activation of the module 5(N). Consequently, the optical transmission device 1 can optimize the environmental temperature inside of the optical transmission device 1 without having to actually activate the module 5(N) mounted into the mounting port 21B(N).

After the estimation of the environmental temperature Tc(N), the optical transmission device 1 determines whether it is possible to control the fan unit 3 corresponding to the module 5(N) to high speed, and, when it is not possible to control the fan unit 3 to high speed, outputs information indicating the failure to mount the module 5(N). Consequently, a user can recognize the failure to mount the module 5(N) on the basis of the output information.

After the estimation of the environmental temperature Tc(N), if it is possible to control the fan unit 3 to high speed and the specified temperature Tb(N) meets a condition of $Tb(N)>Tc(N)+\theta(N)*P(N)$, the optical transmission device 1 determines that it is possible to activate the module 5(N). Then, when it is possible to activate the module 5(N), the card control unit 25 estimates respective temperature increase amounts ΔTc(N) of modules 5 on the leeward side of the module 5(N). Consequently, the card control unit 25 can estimate influence on the modules 5 on the leeward side of the module 5(N) on the basis of the temperature increase amounts ΔTc(N) of the leeward-side modules 5.

When the optical transmission device 1 has detected removal of the module 5(N) from the line card 2, the influence of heat generated from the module 5(N) is eliminated, so temperature margins of the modules 5 on the leeward side of the module 5(N) are increased. Consequently, the card control unit 25 can decrease the fan speed of the fans 31 in the fan unit 3 to low speed, and therefore power consumption of the entire device can be reduced.

When the optical transmission device 1 has detected mounting of a module 5(N) on a line card 2, the optical transmission device 1 estimates an environmental temperature after activation of the module 5(N) before activating the module 5(N). Consequently, the optical transmission device 1 can optimize a fan unit 3 before the activation of the module 5(N) on the basis of the estimated environmental temperature. Furthermore, the optical transmission device 1 can determine whether it is possible to mount a module 5 on the basis of the estimated environmental temperature.

The optical transmission device 1 collects a power consumption P and specified temperature Tb of a module 5 used in estimation of an environmental temperature Tc from a ROM of the module 5 each time; therefore, the optical transmission device 1 can estimate an environmental temperature Tc even in the case of a different type of module 5.

When the optical transmission device 1 has detected removal of a module 5(N) from a line card 2, the influence of heat generated from the module 5(N) is eliminated, so temperature margins of modules 5 on the leeward side of the module 5(N) are increased. Consequently, the card control unit 25 can decrease the fan speed of fans 31 in a fan unit 3 to low speed, and therefore power consumption of the entire device can be reduced.

The present embodiment can be applied to various types of modules besides XFP modules, such as SFP modules and CFP modules, and can also be applied to a configuration in which different types of modules are mixed.

Incidentally, in the above-described first embodiment, with respect to each line card 2 in the optical transmission device 1, a device environment of a module 5 in the line card 2 is determined in response to mounting or removal of the module 5, and the device environment is adjusted on the basis of a result of the determination. However, a device environment can be determined not only with respect to each line card 2 but also with respect to each optical transmission device 1, and the device environment can be adjusted on the basis of a result of the determination. This case is explained as a second embodiment below.

[b] Second Embodiment

Figure 7:
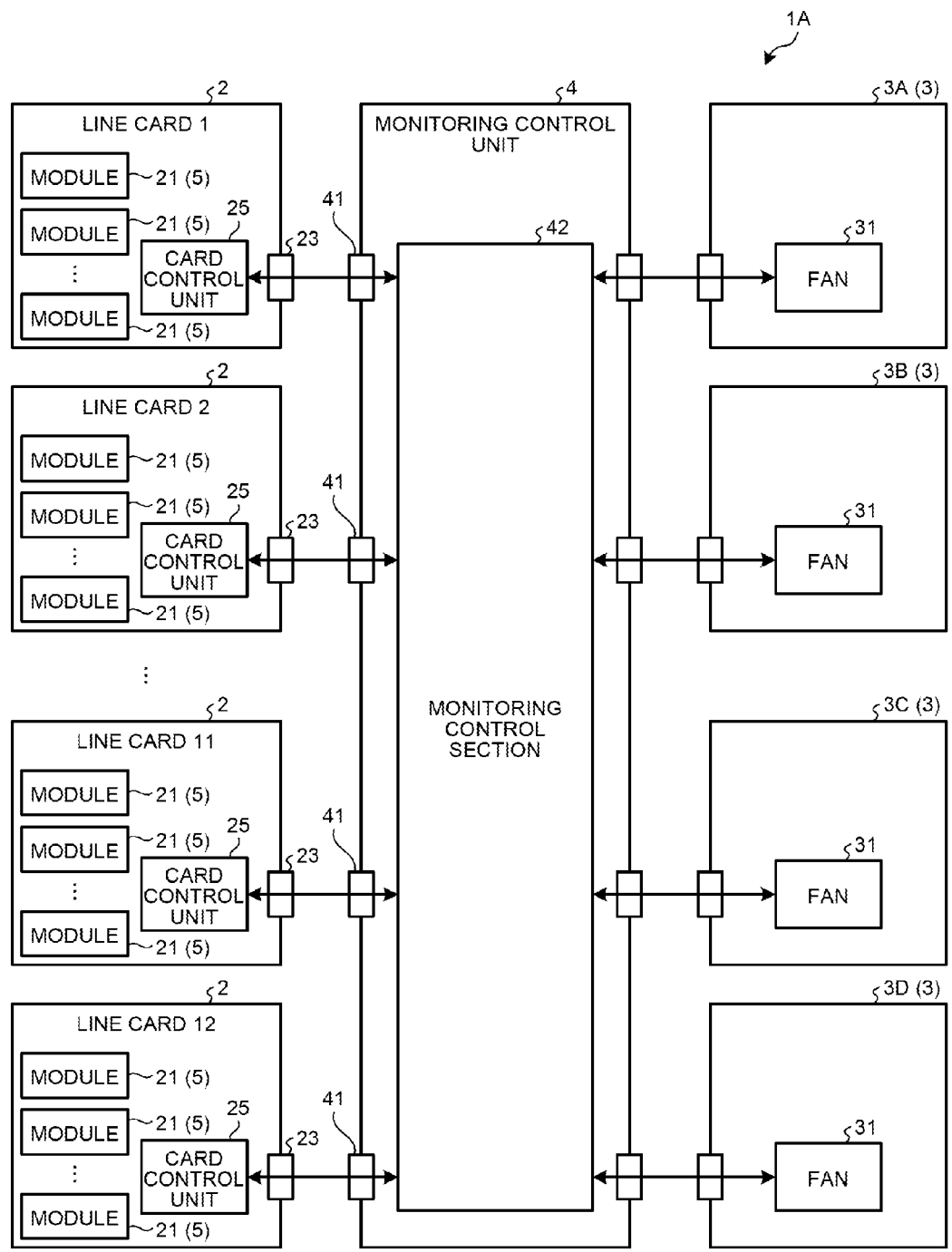
FIG. 7 is an explanatory diagram illustrating an example of an optical transmission device according to a second embodiment.
Figure 8:
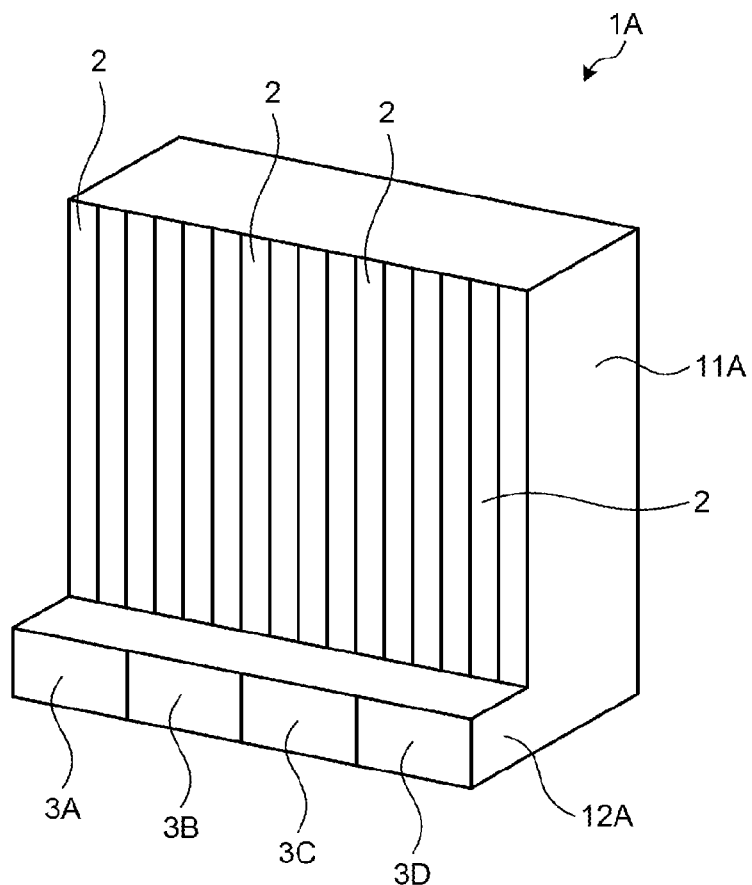
FIG. 8 is an explanatory diagram illustrating an example of the appearance of the optical transmission device according to the second embodiment.

FIG. 7 is an explanatory diagram illustrating an example of an optical transmission device 1A according to the second embodiment. FIG. 8 is an explanatory diagram illustrating an example of the appearance of the optical transmission device 1A according to the second embodiment. Incidentally, for convenience of explanation, the same component as the optical transmission device 1 in the first embodiment is assigned the same reference numeral, and description of a configuration and operation of the component is omitted. The optical transmission device 1A illustrated in FIG. 7 includes, for example, twelve "#1 to #12" line cards 2, four fan units 3, and one monitoring control unit 4. As illustrated in FIG. 8, the line cards 2 and the monitoring control unit 4 are housed/placed in an upper part 11A of the optical transmission device 1A, and, for example, four fan units 3 (3A to 3D) are housed/placed in a lower part 12A.

For example, the fan unit 3A immediately under the "#1 to #3" line cards 2 adjusts the environmental temperatures of the "#1 to #3" line cards 2. For example, the fan unit 3B immediately under the "#4 to #6" line cards 2 adjusts the environmental temperatures of the "#4 to #6" line cards 2. For example, the fan unit 3C immediately under the "#7 to #9" line cards 2 adjusts the environmental temperatures of the "#7 to #9" line cards 2. For example, the fan unit 3D immediately under the "#10 to #12" line cards 2 adjusts the environmental temperatures of the "#10 to #12" line cards 2.

Figure 9:
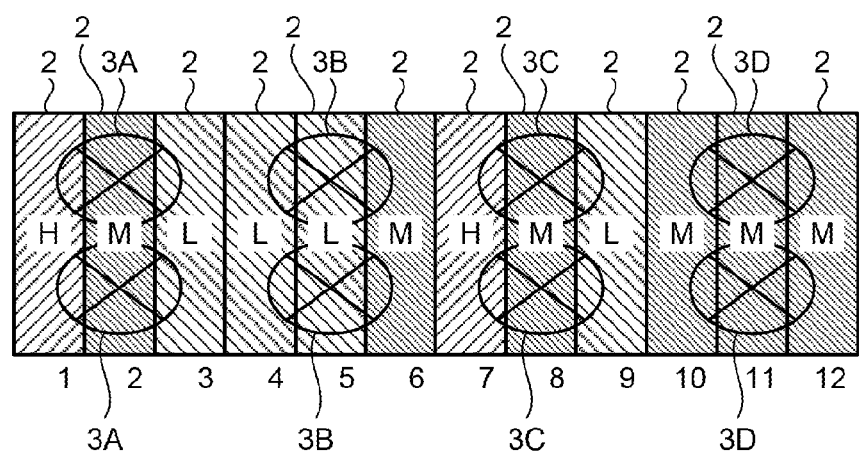
FIG. 9 is an explanatory diagram illustrating an example of an internal device temperature distribution of the optical transmission device.

FIG. 9 is an explanatory diagram illustrating an example of an internal device temperature distribution. The internal device temperature distribution illustrated in FIG. 9 indicates the housing positions of the twelve "#1" to "#12" line cards 2. The fan unit 3A is assigned for the temperature adjustment of the "#1" to "#3" line cards 2. The fan unit 3B is assigned for the temperature adjustment of the "#4" to "#6" line cards 2. The fan unit 3C is assigned for the temperature adjustment of the "#7" to "#9" line cards 2. The fan unit 3D is assigned for the temperature adjustment of the "#10" to "#12" line cards 2.

Furthermore, the internal device temperature distribution expresses respective environmental temperatures of the line cards 2 at three levels: for example, "H (High)", "M (Middle)", and "L (Low)" in ascending order of a temperature margin of environmental temperature. Incidentally, when a temperature margin is less than 10 degrees, a temperature distribution is set to "H"; when a temperature margin is equal to or more than 30 degrees, a temperature distribution is set to "L"; when a temperature margin is equal to or more than 10 degrees but less than 30 degrees, a temperature distribution is set to "M". The monitoring control section 42 in the monitoring control unit 4 collects respective environmental temperatures of the line cards 2 and generates an internal device temperature distribution. Then, the monitoring control section 42 notifies the respective card control units 25 of the line cards 2 of the internal device temperature distribution.

The monitoring control section 42 communicates with the card control unit 25 of each line card 2, and controls the fan unit 3 corresponding to the line card 2 according to a fan control amount received from the card control unit 25. Furthermore, the monitoring control section 42 controls the fan units 3A to 3D, and collects respective controlled states of the fan units 3A to 3D.

Figure 10A:
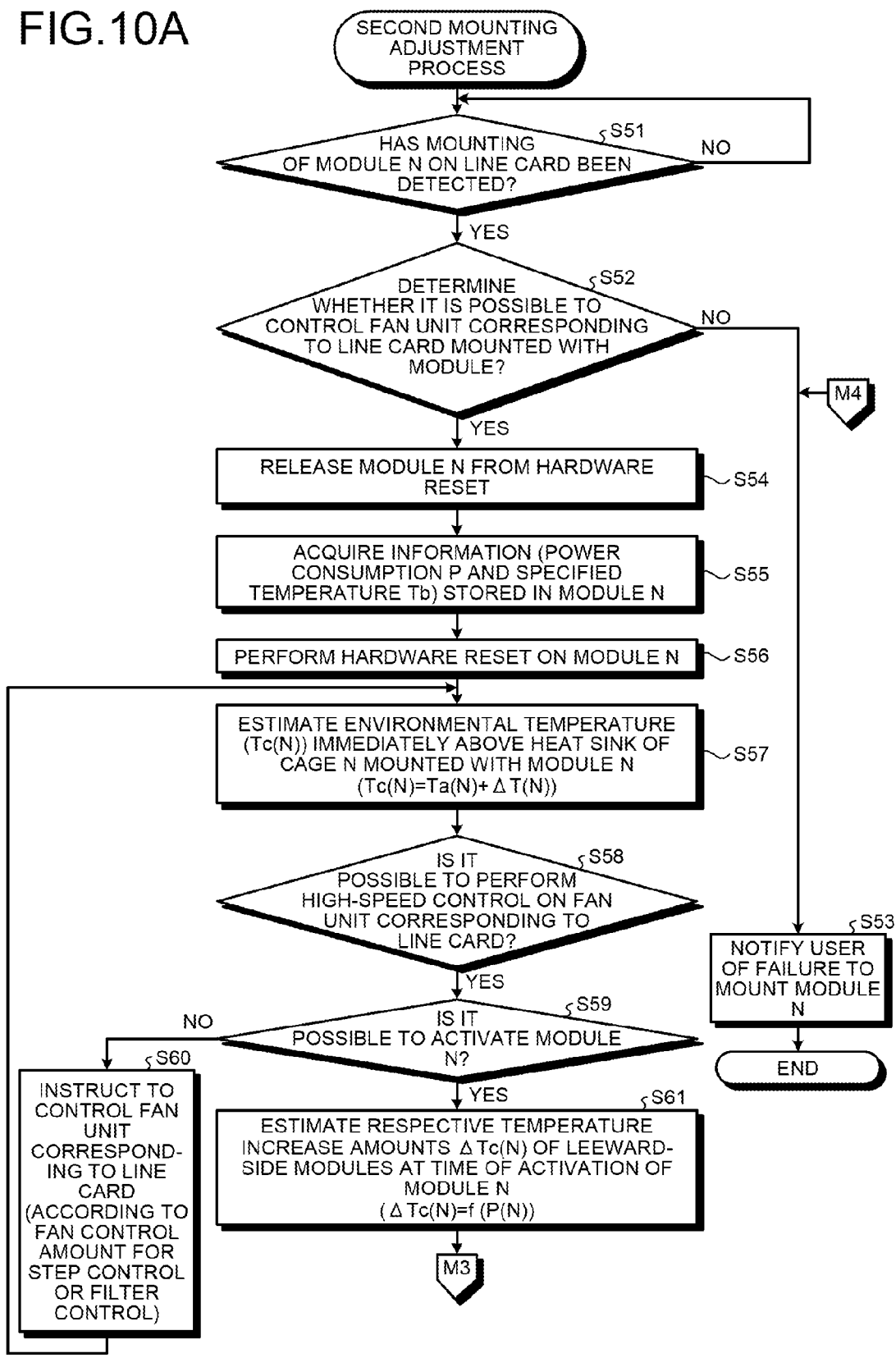
FIG. 10A and FIG. 10B are a flowchart illustrating an example of processing operation of the optical transmission device involved in a second mounting adjustment process.
Figure 10B:
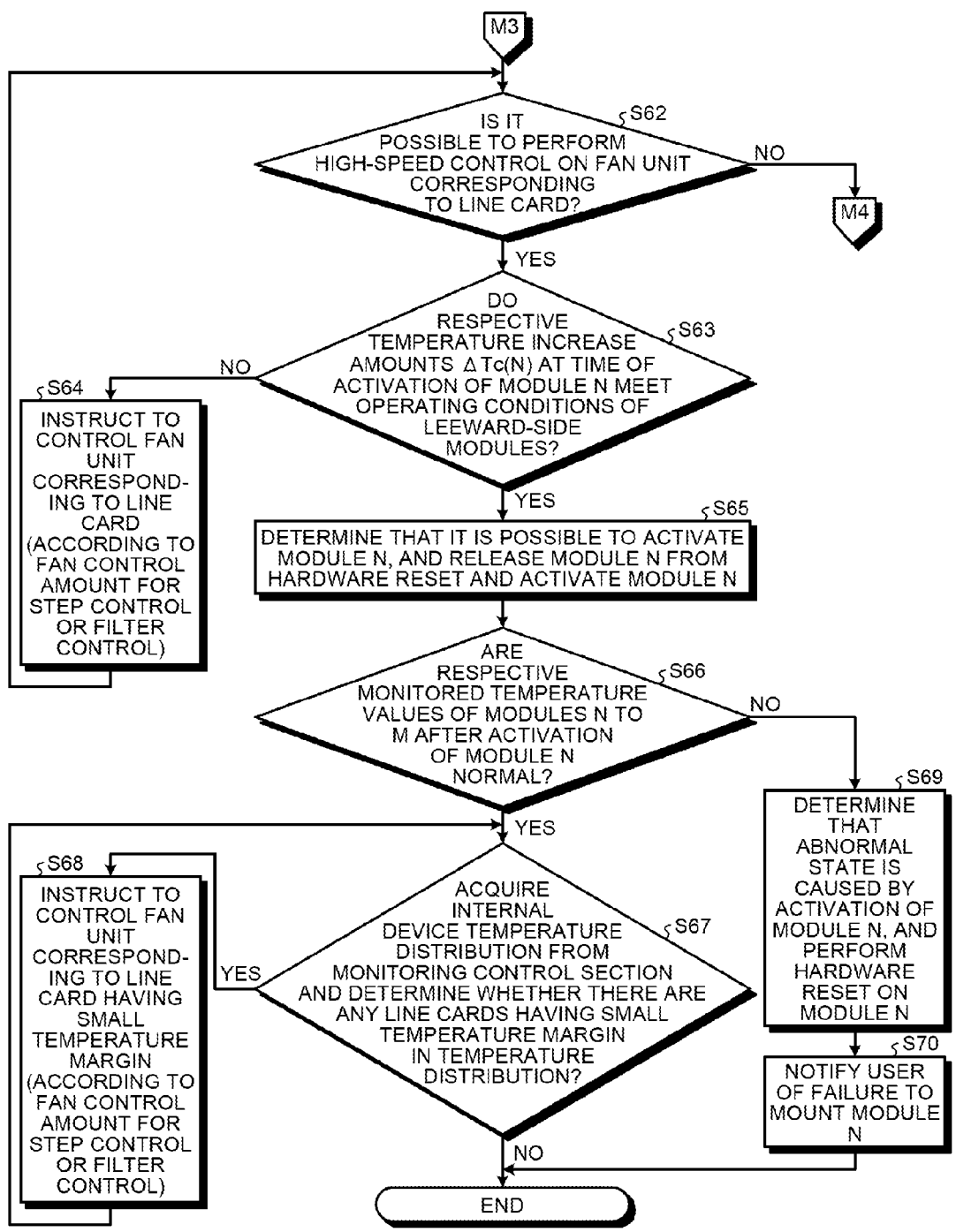

Subsequently, the operation of the optical transmission device 1A according to the second embodiment is explained. FIG. 10A and FIG. 10B are a flowchart illustrating an example of processing operation of the optical transmission device 1A involved in a second mounting adjustment process according to the second embodiment. In the second mounting adjustment process illustrated in FIG. 10A and FIG. 10B, when mounting of a new module 5(N) on any one of the multiple line cards 2 has been detected, whether the optical transmission device 1A is in an environment in which multiple modules 5 can be activated is determined before the module 5(N) is activated. Then, the second mounting adjustment process is a process to adjust the device environment on the basis of a result of the determination. Incidentally, for convenience of explanation, in the optical transmission device 1A, a mounting port 21B(N) shall be unoccupied, and the other mounting ports 21B other than the mounting port 21B(N) shall have been all mounted with modules 5.

In FIG. 10A, whether the detecting section 25A in each card control unit 25 has detected mounting of a module 5 into a mounting port 21B(N) of a line card 2 of the card control unit 25 is determined (Step S51). Incidentally, the detecting section 25A regularly monitors a REMOVE signal output from a mounting port 21B(N) when a module 5(N) is removed from the mounting port 21B(N), and detects whether the module 5(N) has been mounted into the mounting port 21B(N) on the basis of a REMOVE signal.

When mounting of a module 5(N) has been detected (YES at Step S51), the control section 25D in the card control unit 25 determines whether it is possible to control a fan unit 3 corresponding to the line card 2 mounted with the module 5(N) with reference to an internal device temperature distribution (Step S52). Incidentally, when three line cards 2 assigned to, for example, the fan unit 3A are all at "H", there is no room for increase in temperature, so there is no room for the temperature adjustment of the fan unit 3A to high speed, and therefore the control section 25D determines that it is not possible to control the fan unit 3A. On the other hand, when at least one of three line cards 2 assigned to, for example, the fan unit 3A is at "M" or "L", there is room for increase in temperature, and therefore the control section 25D determines that it is possible to control the fan unit 3A to high speed.

When it is not possible to control the fan unit 3 corresponding to the line card 2 mounted with the module 5(N) (NO at Step S52), the control section 25D instructs the monitoring control section 42 to notify a user of the failure to mount the module 5(N) (Step S53). Then, the control section 25D terminates the processing operation illustrated in FIG. 10A. Then, in response to the instruction from the card control unit 25, the monitoring control section 42 outputs a notification of the failure to mount the module 5(N). Consequently, the user can recognize the failure to mount the module 5(N) on the corresponding line card 2 out of the multiple line cards 2 from the notification output from the monitoring control section 42.

When it is not possible to control the fan unit 3 (YES at Step S52), the control section 25D releases the module 5(N) from hardware reset (Step S54). The collecting section 25B collects information stored in a ROM of the module 5(N) released from hardware reset (Step S55). The control section 25D performs hardware reset on the module 5(N) (Step S56). Incidentally, the hardware reset is performed to ignore the influence of heat generated by the module 5(N).

The estimating section 25C estimates an environmental temperature Tc(N) immediately above a heat sink 21C of the mounting port 21B(N) (Step S57). Incidentally, using an ambient environmental temperature Ta(N) measured by the temperature sensor 22 on the windward side of the mounting port 21B(N) and a correction value $\Delta T(N)$, the estimating section 25C calculates $Ta(N)+\Delta T(N)=Tc(N)$. Then, the estimating section 25C calculates the environmental temperature Tc(N) immediately above the heat sink 21C of the mounting port 21B(N).

After the estimation of the environmental temperature Tc(N), the control section 25D specifies a fan unit 3 corresponding to the line card 2 mounted with the module 5(N), and determines whether it is possible to control the specified fan unit 3 to high speed (Step S58). Incidentally, for example, when the line card 2 mounted with the module 5(N) is the "6" line card 2 illustrated in FIG. 9, the fan unit 3B is specified. The control section 25D determines whether a fan control amount of the specified fan unit 3 has reached an upper limit, and, when the fan control amount has reached the upper limit, determines that it is not possible to control the specified fan unit 3 to high speed. On the other hand, when the fan control amount of the specified fan unit 3 has not reached the upper limit, the control section 25D determines that it is possible to control the specified fan unit 3 to high speed.

When the control section 25D has determined that it is not possible to control the specified fan unit 3 to high speed (NO at Step S58), the process returns to Step S53 to notify the user of the failure to mount the module 5(N) into the mounting port 21B(N).

On the other hand, when having determined that it is possible to control the specified fan unit 3 to high speed (YES at Step S58), the control section 25D determines whether it is possible to activate the module 5(N) mounted into the mounting port 21B(N) (Step S59). Incidentally, the collecting section 25B communicates with the module 5(N) and acquires information stored in the module 5(N), and collects a power consumption P and specified temperature Tb included in the acquired stored information. Furthermore, the collecting section 25B collects a thermal resistance value $\theta$ of the mounting port 21B(N) and the heat sink 21C(N). Then, the control section 25D determines whether a condition of $Tb(N)>Tc(N)+\theta(N)*P(N)$ is satisfied. When the condition of $Tb(N)>Tc(N)+\theta(N)*P(N)$ is satisfied, the control section 25D determines that it is possible to activate the module 5(N). On the other hand, when the condition of $Tb(N)>Tc(N)+\theta(N)*P(N)$ is not satisfied, the control section 25D determines that it is not possible to activate the module 5(N).

When having determined that it is not possible to activate the module 5(N) (NO at Step S59), the control section 25D notifies the monitoring control section 42 of a fan control amount of the fan unit 3 corresponding to the line card 2 mounted with the module 5(N) (Step S60). As a result, the monitoring control section 42 performs step control or filter control on the fan unit 3 corresponding to the line card 2 mounted with the module 5(N) according to the fan control amount notified from the card control unit 25. After the control on the fan unit 3 is performed, the process returns to Step S57, and the estimating section 25C estimates an environmental temperature Tc(N) of the mounting port 21B(N).

When the control section 25D has determined that it is possible to activate the module 5(N) (YES at Step S59), the estimating section 25C estimates respective temperature increase amounts $\Delta Tc(N)$ of modules 5 on the leeward side of the module 5(N) at the time of activation of the module 5(N) (Step S61).

The estimating section 25C estimates, for example, as a function of the power consumption P(N) included in the information stored in the module 5(N), an amount $\Delta Tc(N)$ of change in environmental temperature immediately above the heat sink 21C at the time of activation of the module 5(N). Incidentally, $\Delta Tc(N)$ equals $f(P(N))$. A relation between the power consumption P(N) and the environmental temperature change amount $\Delta Tc(N)$ can be obtained through actual measurement in advance and acquired as table information, or can be determined by thermal design simulation.

After the estimation of the respective temperature increase amounts $\Delta Tc(N)$ of all the leeward-side modules 5 at the time of activation of the module 5(N), the control section 25D determines whether it is possible to control the fan unit 3 corresponding to the line card 2 to high speed (Step S62). When it is possible to control the fan unit 3 to high speed (YES at Step S62), the control section 25D determines whether all the mounted modules 5(N+1), 5(N+2), . . . , and 5(M) on the leeward side of the module 5(N) meet operating conditions, respectively (Step S63). For example, the control section 25D determines whether conditions of $Tb(N+1)-Td(N+1)>\Delta Tc(N)$, $Tb(N+2)-Td(N+2)>\Delta Tc(N)$, . . . , and $Tb(M)-Td(M)>\Delta Tc(N)$ are satisfied. Incidentally, the cage temperature Td is a monitored temperature of a cage 21A; for example, Td(N+1) denotes a monitored temperature of a cage 21A(N+1).

When all the leeward-side modules 5 do not meet the operating conditions (NO at Step S63), the control section 25D notifies the monitoring control section 42 of a fan control amount to control the fan unit 3 corresponding to the line card 2 mounted with the module 5(N) (Step S64). As a result, the monitoring control section 42 performs step control or filter control on the fan unit 3 corresponding to the line card 2 mounted with the module 5(N) according to the fan control amount notified from the card control unit 25. After the control on the fan unit 3 is performed, the process returns to Step S62, and the control section 25D determines whether it is possible to control the fan unit 3 to high speed.

When the control section 25D has determined that it is not possible to control the fan unit 3 to high speed (NO at Step S62), the process returns to Step S53 to notify the user of the failure to mount the module 5(N) into the mounting port 21B(N).

When all the leeward-side modules 5 meet the operating conditions (YES at Step S63), the control section 25D determines that it is possible to activate the module 5(N), and releases the module 5(N) from the hardware reset and activates the module 5(N) (Step S65).

After having released the module 5(N) from the hardware reset and activated the module 5(N), the control section 25D determines whether respective monitored temperature values of the module 5(N) and all the leeward-side modules 5(N+1), 5(N+2), . . . , and 5(M) are normal (Step S66).

When respective monitored temperature values Tm of the module 5(N) and all the leeward-side modules 5(N+1), . . . , and 5(M) are less than or equal to normal values Tf (YES at Step S66), the control section 25D acquires an internal device temperature distribution from the monitoring control section 42 (Step S67). Furthermore, the control sections 25D determine whether there are any line cards 2 having a small temperature margin in the internal device temperature distribution on the basis of the internal device temperature distribution (Step S67). Incidentally, a line card 2 having a small temperature margin corresponds to, for example, a line card 2 of which the temperature distribution is at "H" level.

When there is a line card 2 having a small temperature margin in the internal device temperature distribution (YES at Step S67), the corresponding control section 25D notifies the monitoring control section 42 of a fan control amount to increase the fan speed of a fan unit 3 corresponding to the line card 2 having a small temperature margin (Step S68). As a result, the monitoring control section 42 performs step control or filter control on the fan unit 3 corresponding to the line card 2 having a small temperature margin in the internal device temperature distribution according to the fan control amount notified from the card control unit 25.

After the control section 25D has notified the fan control amount to adjust the fan unit 3 to high speed, the process returns to Step S67, and the control sections 25D acquire an internal device temperature distribution and determine whether there are any line cards 2 having a small temperature margin in the internal device temperature distribution. When there are no line cards 2 having a small temperature margin in the internal device temperature distribution (NO at Step S67), the control sections 25D terminate the processing operation illustrated in FIG. 10B.

Furthermore, when any of respective monitored temperature values Tm of the module 5(N) and all the leeward-side modules 5 exceed the normal values Tf (NO at Step S66), the control section 25D determines that an abnormal state is caused by the activation of the module 5(N) (Step S69). Then, when having determined that an abnormal state is caused by the activation of the module 5(N), the control section 25D performs hardware reset on the module 5(N) (Step S69). After performing hardware reset on the module 5(N), the control section 25D instructs the monitoring control section 42 to notify the user of the failure to mount the module 5(N) (Step S70), and terminates the processing operation illustrated in FIG. 10B. Then, in response to the instruction from the card control unit 25, the monitoring control section 42 outputs a notification of the failure to mount the module 5(N). Consequently, the user can recognize the failure to mount the module 5(N) from the notification output from the monitoring control section 42. When the detecting section 25A has not detected mounting of a module 5 (NO at Step S51), Step S51 is repeated until the detecting section 25A has detected mounting of a module 5.

Upon detection of mounting of a module 5(N) on any line card 2 in the optical transmission device 1A, the card control unit 25 collects an ambient environmental temperature Ta(N) of a cage 21A(N). Then, the card control unit 25 estimates an environmental temperature Tc(N) immediately above a heat sink 21C of the cage 21A(N) on the basis of the ambient environmental temperature Ta(N) and a correction value $\Delta T(N)$. Consequently, the card control unit 25 can estimate an environmental temperature Tc(N) after activation of the module 5(N) without having to actually activate the module 5(N) mounted into a mounting port 21B(N).

Furthermore, after the estimation of the environmental temperature Tc(N), the card control unit 25 determines whether it is possible to control a fan unit 3 corresponding to the module 5(N) to high speed, and, when it is not possible to control the fan unit 3 to high speed, outputs information indicating the failure to mount the module 5(N). Consequently, a user can recognize the failure to mount the module 5(N) on the basis of the output information.

After the estimation of the environmental temperature Tc(N), if it is possible to control the fan unit 3 to high speed and a specified temperature Tb(N) meets a condition of $Tb(N) > Tc(N) + \theta(N)*P(N)$, the card control unit 25 determines that it is possible to activate the module 5(N). Then, when it is possible to activate the module 5(N), the card control unit 25 estimates respective temperature increase amounts $\Delta Tc(N)$ of modules 5 on the leeward side of the module 5(N). Consequently, the card control unit 25 can estimate influence on the modules 5 on the leeward side of the module 5(N) on the basis of the temperature increase amounts $\Delta Tc(N)$ of the leeward-side modules 5.

When it is not possible to control the fan unit 3 corresponding to the module 5(N) to high speed, the card control unit 25 outputs information indicating the failure to mount the module 5(N). Consequently, the user can recognize the failure to mount the module 5(N) on the basis of the output information.

When it is possible to control the fan unit 3 corresponding to the module 5(N) to high speed, and it is not possible to activate the module 5(N), the card control unit 25 controls fans 31 in the fan unit 3 to put the cage 21A(N) into a state capable of activating the module 5(N). Consequently, by controlling the fans 31, the card control unit 25 can adjust the temperature to a temperature at which the module 5(N) can be activated.

After the estimation of the temperature increase amounts $\Delta Tc(N)$ of the modules 5 on the leeward side of the module 5(N), if it is possible to control the fan unit 3 to high speed and the temperature increase amounts $\Delta Tc(N)$ meet operating conditions of the leeward-side modules 5, the card control unit 25 activates the module 5(N). Then, after the activation of the module 5(N), the card control unit 25 determines whether respective monitored temperature values of the module 5(N) to 5(M) are normal, and, if any of the monitored temperature values are not normal, outputs information indicating an abnormal state due to the activation of the module 5(N). Consequently, the user can recognize abnormality of the module 5(N) on the basis of the output information.

When any of the temperature increase amounts ΔTc(N) do not meet the operating conditions of the leeward-side modules 5, the card control unit 25 controls the fans 31 so that the operating conditions of the leeward-side modules 5 are satisfied. Consequently, by controlling the fans 31, the card control unit 25 can adjust the temperature to a temperature at which the operating conditions of the leeward-side modules 5 are satisfied.

The card control unit 25 determines whether it is possible to control the fan unit 3 corresponding to the line card 2 mounted with the module 5(N) with reference to the internal device temperature distribution, and, when it is not possible to control the fan unit 3, notifies a user of the failure to mount the module 5(N). Consequently, the user can recognize the failure to mount the module 5(N) on the basis of output information.

The card control unit 25 determines whether there are any line cards 2 having a small temperature margin with reference to the internal device temperature distribution, and, when there is a line card 2 having a small temperature margin, controls a fan unit 3 corresponding to the line card 2 having a small temperature margin. Consequently, the card control unit 25 can adjust the temperature of the line card 2 in the optical transmission device 1A after the activation of the module 5(N).

Figure 11:
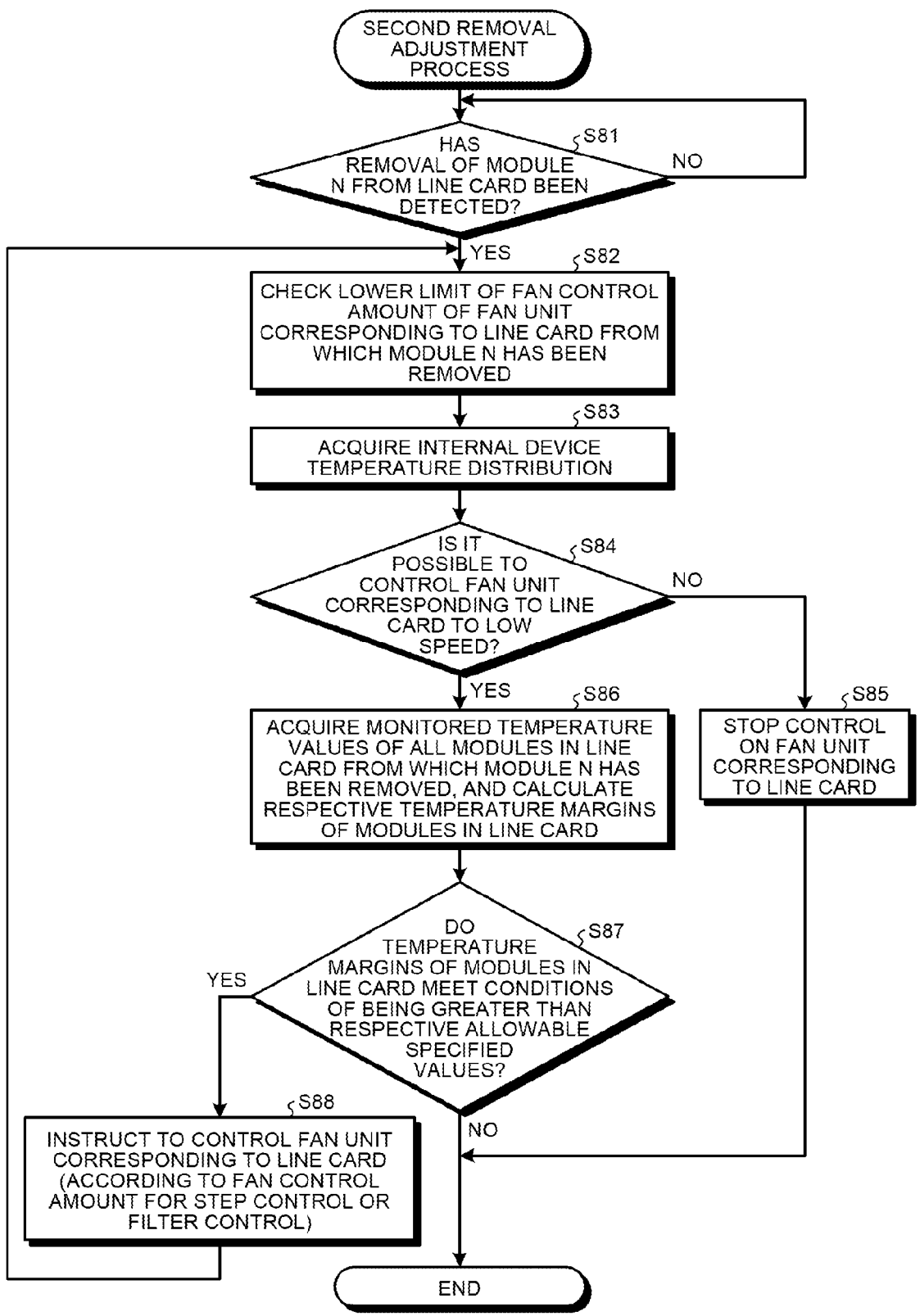
FIG. 11 is a flowchart illustrating an example of processing operation of the optical transmission device involved in a second removal adjustment process.

Subsequently, the operation of the optical transmission device 1A when a module 5 is removed from a line card 2 is explained. FIG. 11 is a flowchart illustrating an example of processing operation of the optical transmission device 1A involved in a second removal adjustment process according to the second embodiment. Incidentally, for convenience of explanation, assume that a module 5(N) mounted on, for example, the "4" line card 2 out of multiple line cards 2 is removed. The second removal adjustment process is a process to control, upon detection of removal of a module 5(N) from a mounting port 21B in any line card 2 in the optical transmission device 1A, a fan unit 3 corresponding to the module 5(N) to low speed if it is possible.

In FIG. 11, whether the detecting section 25A has detected removal of a module 5(N) from a line card 2 in the optical transmission device 1A is determined (Step S81). Incidentally, the detecting section 25A regularly monitors a REMOVE signal from a mounting port 21B(N), and detects whether a module 5(N) has been removed from the mounting port 21B(N) on the basis of a REMOVE signal.

When removal of a module 5(N) has been detected (YES at Step S81), the control section 25D checks a lower limit of a fan control amount of a fan unit 3 corresponding to the line card 2 from which the module 5(N) has been removed (Step S82). The control section 25D acquires an internal device temperature distribution from the monitoring control section 42 (Step S83), and determines whether it is possible to control the fan unit 3 corresponding to the line card 2 from which the module 5(N) has been removed to low speed (Step S84). Incidentally, the control section 25D determines whether a fan control amount has reached the lower limit, and, when the fan control amount has reached the lower limit, determines that it is not possible to control the fan unit 3 to low speed. On the other hand, when the fan control amount has not reached the lower limit, the control section 25D determines that it is possible to control the fan unit 3 to low speed.

When having determined that it is not possible to control the fan unit 3 to low speed (NO at Step S84), the control section 25D notifies the monitoring control section 42 of that so as to halt the fan unit 3 corresponding to the line card 2 (Step S85), and terminates the processing operation illustrated in FIG. 11. Consequently, the optical transmission device 1A can reduce power consumption of the entire device in accordance with the halt of the fan unit 3.

When having determined that it is possible to control the fan unit 3 to low speed (YES at Step S84), the control section 25D calculates respective temperature margins of all modules 5 in the line card 2 from which the module 5(N) has been removed (Step S86). Incidentally, the collecting section 25B collects a specified temperature Tb of each module 5 from stored information in the module 5. Furthermore, the control section 25D collects a monitored temperature value Tm of each module 5. The control section 25D calculates a temperature margin Tx of each module 5 using an equation of Tb−Tm based on the specified temperature Tb and monitored temperature value Tm of the module 5. The temperature margin Tx is a difference in temperature between the monitored temperature value Tm, which is the current temperature, and the specified temperature Tb, and is a margin of temperature increase from the current temperature Tm up to the specified temperature Tb.

The control section 25D calculates respective temperature margins Tx of the modules 5 on the basis of $Tx(1)=Tb(1)-Tm(1)$, $Tx(2)=Tb(2)-Tm(2)$, ..., and $Tx(M)=Tb(M)-Tm(M)$. In this way, the control section 25D calculates the respective temperature margins Tx of all the modules 5 in the line card 2 from which the module 5(N) has been removed.

After having calculated the respective temperature margins Tx of the modules 5 in the line card 2, the control section 25D determines whether the temperature margins Tx of the modules 5 meet conditions of being greater than respective allowable specified values Tz (Step S87). Incidentally, the allowable specified value Tz is an allowable specified value that each module 5 can withstand. The control section 25D determines whether the conditions of $Tx(1)>Tz(1)$, $Tx(2)>Tz(2)$, ..., and $Tx(M)>Tz(M)$ are all satisfied.

When all the temperature margins Tx of the modules 5 meet the conditions of being greater than the respective allowable specified values Tz (YES at Step S87), the control section 25D notifies the monitoring control section 42 of a fan control amount to control the fan unit 3 corresponding to the line card 2 (Step S88). The monitoring control section 42 decreases the fan speed of fans 31 in the fan unit 3 corresponding to the line card 2 to low speed according to the fan control amount notified from the card control unit 25. Consequently, the optical transmission device 1A can reduce power consumption of the entire device by the decrease in the fan speed of the fans 31 in the device. Then, after the control section 25D has notified the fan control amount at Step S88, the process returns to Step S82.

On the other hand, when all the temperature margins Tx of the modules 5 do not meet the conditions of being greater than the respective allowable specified values Tz (NO at Step S87), the card control unit 25 terminates the processing operation illustrated in FIG. 11. Furthermore, when removal of a module 5(N) has not been detected (NO at Step S81), Step S81 is repeated until the detecting section 25A has detected removal of a module 5(N).

When the card control unit 25 has detected removal of a module 5(N) from any line card 2 in the optical transmission device 1A, the influence of heat generated from the module 5(N) is eliminated, so temperature margins of modules 5 on the leeward side of the module 5(N) are increased. Consequently, the card control unit 25 can adjust a fan unit 3 corresponding to the line card 2 from which the module 5(N) has been removed to low speed, and therefore power consumption of the entire optical transmission device 1A can be reduced.

When the optical transmission device 1A according to the second embodiment has detected mounting of a module 5(N) on any internal line card 2, the optical transmission device 1A collects an ambient environmental temperature Ta(N) of a cage 21A(N). The optical transmission device 1A estimates an environmental temperature Tc(N) immediately above a heat sink 21C of the cage 21A(N) on the basis of the ambient environmental temperature Ta(N) of the cage 21A (N) and a correction value ΔT(N). Consequently, the optical transmission device 1A can estimate an environmental temperature Tc(N) after activation of the module 5(N) without having to actually activate the module 5(N) mounted into a mounting port 21B(N).

The optical transmission device 1A determines whether it is possible to control a fan unit 3 corresponding to the line card 2 mounted with the module 5(N) with reference to the internal device temperature distribution, and, when it is not possible to control the fan unit 3, notifies a user of the failure to mount the module 5(N). Consequently, the user can recognize the failure to mount the module 5(N) on the basis of output information.

The optical transmission device 1A determines whether there are any line cards 2 having a small temperature margin with reference to the internal device temperature distribution, and, when there is a line card 2 having a small temperature margin, controls a fan unit 3 corresponding to the line card 2 having a small temperature margin. Consequently, the optical transmission device 1A can adjust the temperature of the line card 2 in the optical transmission device 1A after the activation of the module 5(N).

When the optical transmission device 1A has detected removal of a module 5(N) from any internal line card 2, the influence of heat generated from the module 5(N) is eliminated, so temperature margins of modules 5 on the leeward side of the module 5(N) are increased. Consequently, the optical transmission device 1A can adjust a fan unit 3 corresponding to the line card 2 from which the module 5(N) has been removed to low speed, and therefore can reduce power consumption of the optical transmission device 1A.

Figure 12:
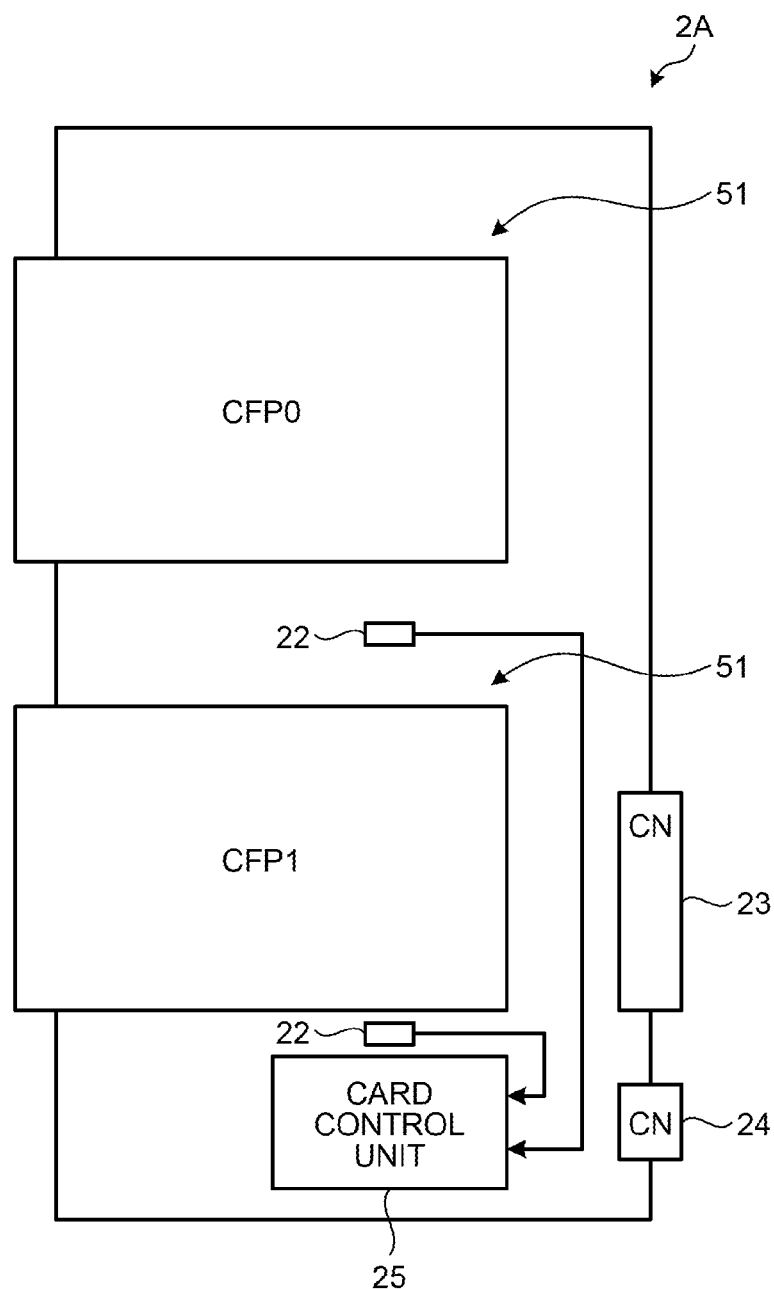
FIG. 12 is an explanatory diagram illustrating an example of a line card mounted with CFP modules.

Incidentally, in the above-described embodiments, XFP modules are described as an example of modules 5 mounted on a line card 2; however, the type of modules is not limited to XFP, and the modules 5 can be other types of modules, such as SFP modules and CFP modules. FIG. 12 is a diagram illustrating an example of a line card 2A mounted with CFP modules. The same component as the line card 2 illustrated in FIG. 1 is assigned the same reference numeral, and description of a configuration and operation of the component is omitted. The line card 2A illustrated in FIG. 12 includes the temperature sensors 22, the connection connector 23, the power connector 24, and the card control unit 25. Two CFP modules 51 are removably mounted on the line card 2A. Furthermore, the line card 2A is also applicable to a state in which the CFP modules 51 and other module(s) 5 having different specifications, such as SFP and CFP as well as XFP, are mixed.

In the above-described embodiments, the temperature sensor 22 is placed near the windward side of each cage 21A; however, the temperature sensor 22 can be placed in any position as long as the temperature sensor 22 can measure an ambient environmental temperature Ta capable of an accurate estimate of an environmental temperature Tc immediately above a heat sink 21C in the position.

In the above-described embodiments, it takes time to converge the temperature after the adjustment of the fans 31; therefore, a temporal variation amount can be set according to an ambient environmental temperature Ta and a monitored temperature value, and a further adjustment can be made if a variation amount falls below the set value.

A correction value ΔT and a thermal resistance value θ vary according to the position of a mounting port 21B into which a module 5 on a line card 2 (2A) is mounted; therefore, it may be as well to obtain these values separately.

In the optical transmission device 1 (1A) according to the above-described embodiments, the fan unit(s) 3 is placed in the lower part 12 (12A) of the device; however, the present embodiments can be applied to the case where the fan unit(s) 3 is placed in the upper part 11 (11A) of the device.

There are described examples of the configuration of the fan unit 3, the number of line cards (2A), and the positions of the line cards 2 (2A) placed in the optical transmission device 1 (1A), etc.; however, these can be arbitrarily changed.

In the above-described embodiments, the card control unit 25 on a line card 2 collects information of an ambient environmental temperature Ta, a power consumption P, specified temperature Tb, and a thermal resistance value θ, etc., and performs a process of estimating an environmental temperature Tc after activation of a module 5 on the basis of the collected information before activating the module 5. However, this can be performed by, for example, the monitoring control section 42 in the monitoring control unit 4 instead of the card control unit 25 on a line card 2.

Furthermore, respective components of the units illustrated in the drawings do not always have to be physically configured as illustrated in the drawings. That is, the specific forms of division and integration of the units are not limited to those illustrated in the drawings, and all or some of the units can be configured to be functionally or physically divided or integrated in arbitrary units depending on respective loads and use conditions, etc.

Moreover, all or any part of various processing functions implemented in each device can be performed on a central processing unit (CPU) (or a microcomputer, such as a micro-processing unit (MPU) or a micro controller unit (MCU)). Furthermore, it goes without saying that all or any part of the processing functions can be performed on a program that is analyzed and executed by the CPU (or a microcomputer, such as an MPU or an MCU) or on hardware using wired logic.

Figure 13:
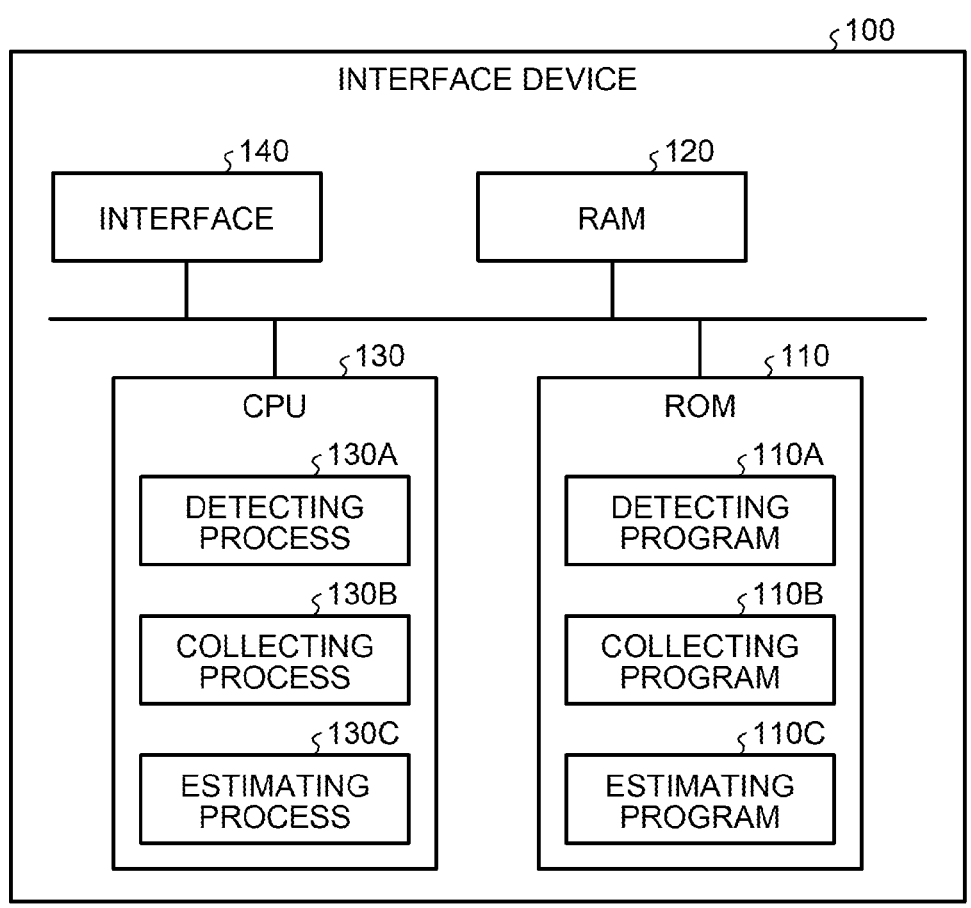
FIG. 13 is an explanatory diagram illustrating an example of an interface device that executes a monitoring control program.

The various processes described in the present embodiments can be realized by causing an interface device to execute a program prepared in advance. An example of the interface device that executes a program having the same functions as those described in the above embodiments is explained below. FIG. 13 is an explanatory diagram illustrating an example of an interface device 100 that executes a monitoring control program.

In FIG. 13, the interface device 100, which executes the monitoring control program, includes a ROM 110, a RAM 120, a CPU 130, and an interface 140.

The monitoring control program that fulfills the same functions as those described in the above embodiments has been stored in the ROM 110 in advance. Incidentally, the monitoring control program can be recorded on not the ROM 110 but a recording medium that a drive (not illustrated) can read. As the recording medium, for example, portable recording media, such as a CD-ROM, a DVD, a USB flash drive, and an SD card, and a semiconductor memory such as a flash memory can be used. The monitoring control program includes a detecting program 110A, a collecting program 110B, and an estimating program 110C. Incidentally, the programs 110A to 110C can be arbitrarily integrated or divided.

The CPU 130 reads out these programs 110A to 110C from the ROM 110, and executes the read programs. The programs 110A to 110C executed by the CPU 130 work as a detecting process 130A, a collecting process 130B, and an estimating process 130C.

The CPU 130 detects mounting of a module into a mounting port on a communication card equipped with multiple cages that each have a mounting port into which a module is removably mounted. When having detected mounting of a module, the CPU 130 collects an environmental temperature around the mounting port into which the module has been mounted, a power consumption and specified temperature of the module, and thermal resistance information of a cage mounted with the module. The CPU 130 estimates an environmental temperature after activation of the module on the basis of the collected environmental temperature, power consumption, specified temperature, and thermal resistance information before activating the module of which the mounting has been detected. Consequently, the environmental temperature after activation of the module can be estimated before the module is activated.

It is possible to estimate an environmental temperature after activation of a mounted module before the module is activated.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A monitoring control device comprising:
   a memory; and
   a processor coupled to the memory,
   wherein the processor executes a process comprising:
   detecting mounting of a module into a mounting part in a communication card equipped with multiple mounting parts into which modules are removably mounted;
   collecting, when mounting of a module has been detected, an environmental temperature, measured by a sensor of the monitoring control device, around a mounting part into which the module has been mounted, a power consumption and specified temperature of the module, memorized in the memory, and thermal resistance information of the mounting part mounted with the module; and
   estimating an environmental temperature after activation of the module on the basis of the collected environmental temperature, power consumption, specified temperature, and thermal resistance information before the module of which the mounting has been detected is activated.

2. The monitoring control device according to claim 1, wherein the process includes controlling fans for cooling the communication card on the basis of the environmental temperature after activation of the module estimated by the estimating.

3. The monitoring control device according to claim 2, wherein
   the estimating estimates environmental temperatures of other modules in the communication card mounted with the module of which the mounting has been detected on the basis of the estimated environmental temperature after activation of the module, and
   the controlling controls fans corresponding to the other modules on the basis of the environmental temperatures of the other modules estimated by the estimating.

4. The monitoring control device according to claim 3, wherein
   when a control amount of a fan corresponding to the module of which the mounting has been detected has exceeded an upper limit, before activating the module of which the mounting has been detected, the controlling determines whether it is possible to activate the module on the basis of the environmental temperature estimated by the estimating.

5. The monitoring control device according to claim 2, wherein
   upon detection of removal of a module from a mounting part in the communication card, the collecting collects respective environmental temperatures of modules mounted on the communication card other than the module removed from the mounting part, and
   the controlling controls fan speed of a fan corresponding to the removed module to low speed on the basis of a result of the collection of the respective environmental temperatures of the modules.

6. The monitoring control device according to claim 5, wherein the process comprises monitoring a temperature state of each communication card in a transmission device equipped with multiple communication cards, and wherein
   the controlling determines whether it is possible to control a fan corresponding to each communication card in the transmission device on the basis of a temperature state of each communication card.

7. The monitoring control device according to claim 2, wherein
   the controlling monitors a convergence state of a monitored temperature value on the communication card, and, when having determined that it is convergence within a certain temperature range, performs control on the fans stepwise in an adjusting direction.

8. The monitoring control device according to claim 1, wherein
   the estimating uses a control amount to control fan speed of a fan, the fan being installed in a transmission device equipped with the communication card and cooling the communication card, as a function of the thermal resistance information.

9. A monitoring control method implemented by a monitoring control device for a communication card equipped with multiple mounting parts into which modules are removably mounted, the monitoring control method comprising:
   detecting mounting of a module into any of the mounting parts;

upon detection of mounting of a module, collecting an environmental temperature, measured by a sensor of the monitoring control device, around a mounting part into which the module has been mounted, a power consumption and specified temperature of the module, memorized in a memory of the monitoring control device, and thermal resistance information of the mounting part mounted with the module; and estimating an environmental temperature after activation of the module on the basis of the collected environmental temperature, power consumption, specified temperature, and thermal resistance information before the module of which the mounting has been detected is activated.

10. A non-transitory computer-readable recording medium having stored therein a monitoring control program of a monitoring control device for a communication card equipped with multiple mounting parts into which modules are removably mounted, wherein the program causes the monitoring control device to execute a process comprising:

detecting mounting of a module into any of the mounting parts;

upon detection of mounting of a module, collecting an environmental temperature, measured by a sensor of the monitoring control device, around a mounting part into which the module has been mounted, a power consumption and specified temperature of the module, memorized in a memory of the monitoring control device, and thermal resistance information of the mounting part mounted with the module; and estimating an environmental temperature after activation of the module on the basis of the collected environmental temperature, power consumption, specified temperature, and thermal resistance information before the module of which the mounting has been detected is activated.

* * * * *